(12) United States Patent
Kuramoto et al.

(10) Patent No.: US 10,090,446 B2
(45) Date of Patent: Oct. 2, 2018

(54) LIGHT EMITTING DEVICE AND METHOD FOR MANUFACTURING THE SAME

(75) Inventors: Masafumi Kuramoto, Tokushima (JP); Daisuke Iwakura, Komatsushima (JP); Kenji Ozeki, Tokushima (JP); Tomoaki Tsuruha, Anan (JP); Satoshi Okada, Anan (JP); Masaki Hayashi, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 655 days.

(21) Appl. No.: 14/118,176

(22) PCT Filed: May 15, 2012

(86) PCT No.: PCT/JP2012/062418
§ 371 (c)(1),
(2), (4) Date: Jan. 15, 2014

(87) PCT Pub. No.: WO2012/157644
PCT Pub. Date: Nov. 22, 2012

(65) Prior Publication Data
US 2014/0124812 A1    May 8, 2014

(30) Foreign Application Priority Data

May 16, 2011 (JP) ................................. 2011-109134
Jul. 26, 2011 (JP) ................................. 2011-163510

(51) Int. Cl.
*H01L 33/54* (2010.01)
*H01L 33/52* (2010.01)
(Continued)

(52) U.S. Cl.
CPC .............. *H01L 33/52* (2013.01); *H01L 24/97* (2013.01); *H01L 33/54* (2013.01); *H01L 24/45* (2013.01);
(Continued)

(58) Field of Classification Search
CPC .......... H01L 33/48; H01L 33/52; H01L 33/54
See application file for complete search history.

(56) References Cited

U.S. PATENT DOCUMENTS 6,274,890 B1    8/2001 Oshio et al.
6,489,637 B1    12/2002 Sakamoto et al.
(Continued)

FOREIGN PATENT DOCUMENTS

CN    102034924 A    4/2011
JP    10-261821 A    9/1998
(Continued)

OTHER PUBLICATIONS

International Search Report received in PCT/JP2012/062418 dated Aug. 21, 2012.
(Continued)

*Primary Examiner* — Jae Lee
(74) *Attorney, Agent, or Firm* — Foley & Lardner LLP

(57) ABSTRACT

To provide a light emitting device having high light extraction efficiency, and a method for manufacturing the light emitting device. A method for manufacturing a light emitting device (100) according to the present invention, includes: forming a sealing member (40) for sealing a light emitting element (10) on a base body (30) by dropping, the base body (30) including a conductive member (20) for connecting to the light emitting element (10), and a molding (25) integrally molded with the conductive member (20); the sealing member (10) being formed such that at least a part of a periphery of the sealing member (40) is located on an outward surface (38) of the conductive member (20) or the molding (25), the outward surface facing outward in a top view.

43 Claims, 13 Drawing Sheets

(51) Int. Cl.
*H01L 23/00* (2006.01)
*H01L 25/075* (2006.01)

(52) U.S. Cl.
CPC .............. *H01L 25/0753* (2013.01); *H01L 2224/45124* (2013.01); *H01L 2224/45139* (2013.01); *H01L 2224/45144* (2013.01); *H01L 2224/45147* (2013.01); *H01L 2224/45169* (2013.01); *H01L 2224/48091* (2013.01); *H01L 2224/48137* (2013.01); *H01L 2224/48247* (2013.01); *H01L 2224/8592* (2013.01); *H01L 2224/97* (2013.01); *H01L 2924/01015* (2013.01); *H01L 2924/01047* (2013.01); *H01L 2924/01322* (2013.01); *H01L 2924/07802* (2013.01); *H01L 2924/12041* (2013.01); *H01L 2924/12042* (2013.01); *H01L 2924/181* (2013.01); *H01L 2933/005* (2013.01)

(56) References Cited

U.S. PATENT DOCUMENTS

| | | | |
|---|---|---|---|
| 6,548,832 | B1 | 4/2003 | Sakamoto et al. |
| 6,730,933 | B1 | 5/2004 | Shimizu et al. |
| 2007/0029569 | A1 | 2/2007 | Andrews |
| 2007/0170454 | A1* | 7/2007 | Andrews ............ H01L 33/52 257/100 |
| 2007/0278512 | A1 | 12/2007 | Loh et al. |
| 2008/0029775 | A1* | 2/2008 | Liu et al. ............... 257/98 |
| 2008/0191237 | A1 | 8/2008 | Andrews |
| 2008/0281056 | A1 | 11/2008 | Tabei |
| 2009/0065792 | A1* | 3/2009 | Thompson .......... H01L 33/54 257/98 |
| 2010/0073917 | A1 | 3/2010 | Loh et al. |
| 2010/0327295 | A1 | 12/2010 | Peng et al. |
| 2011/0001152 | A1 | 1/2011 | Chung et al. |
| 2011/0053297 | A1 | 3/2011 | Andrews |
| 2011/0068674 | A1* | 3/2011 | Takenaka .............. F21K 9/23 313/318.07 |
| 2012/0014110 | A1 | 1/2012 | Sanpei et al. |
| 2012/0061702 | A1 | 3/2012 | Andrews et al. |

FOREIGN PATENT DOCUMENTS

| | | |
|---|---|---|
| JP | 11-031761 A | 2/1999 |
| JP | 2000-315823 A | 11/2000 |
| JP | 2001-57446 A | 2/2001 |
| JP | 2004-179343 A | 6/2004 |
| JP | 2006-066786 A | 3/2006 |
| JP | EPO 2006066786 * | 3/2006 |
| JP | 2006-269778 A | 10/2006 |
| JP | 2008-130836 A | 6/2008 |
| JP | 2008-147270 A | 6/2008 |
| JP | 2009-503888 A | 1/2009 |
| JP | 2010-003994 A | 1/2010 |
| JP | 2011-014860 A | 1/2011 |
| TW | 200717855 A | 5/2007 |
| TW | 200911927 A | 3/2009 |
| TW | 201101457 A1 | 1/2011 |
| WO | WO-2008/018336 A1 | 2/2008 |
| WO | WO-2010/021346 A1 | 2/2010 |
| WO | WO 2010/113852 A1 | 10/2010 |

OTHER PUBLICATIONS

Extended European Search Report dated Oct. 24, 2014 issued in Application No. 12786606.9.
Office Action dated Jan. 28, 2016 issued in Taiwanese Application No. 101117454.
Office Action issued in Japanese Patent Application No. 2013-515166 dated Mar. 22, 2016.
Office Action dated May 9, 2017 in corresponding Japanese Patent Application No. 2016-146234.

* cited by examiner

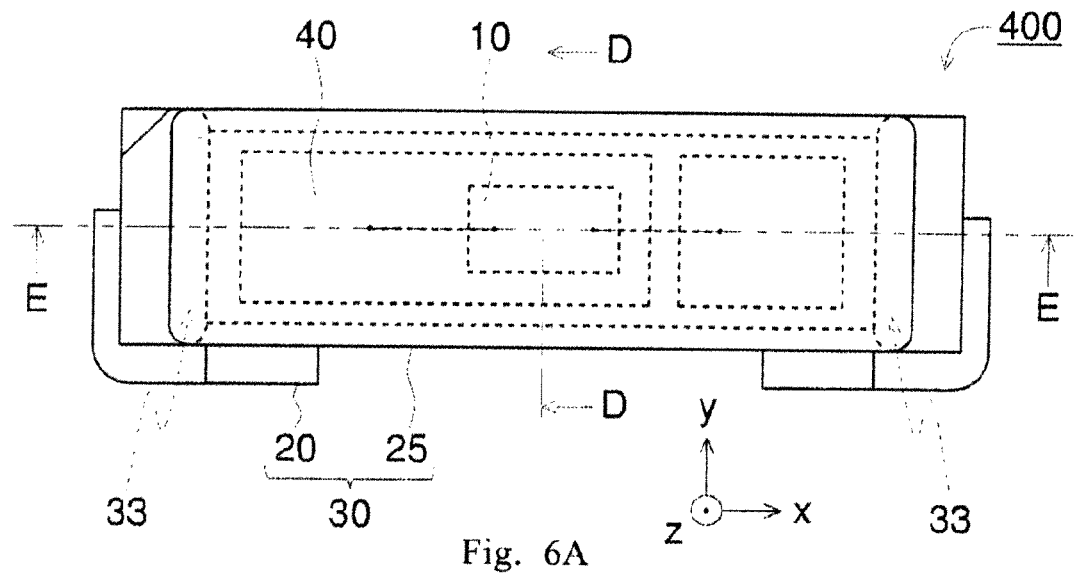
Fig. 6A
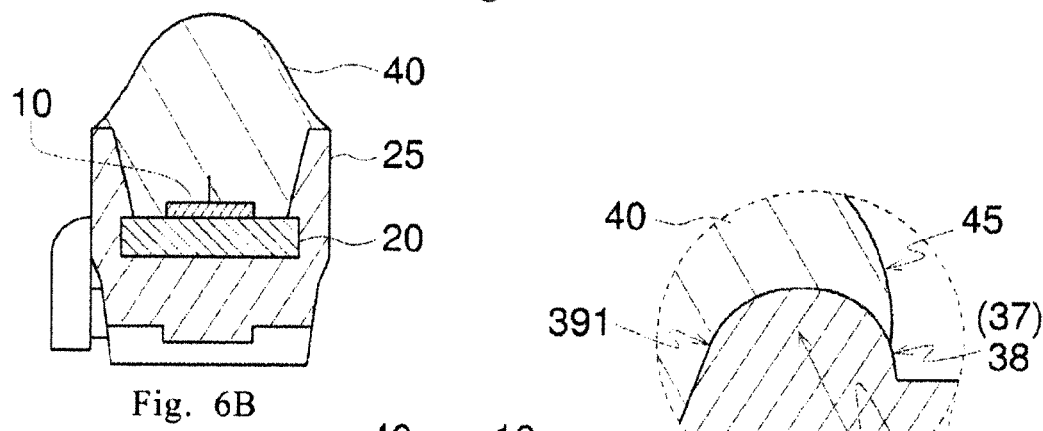
Fig. 6B
Fig. 6C
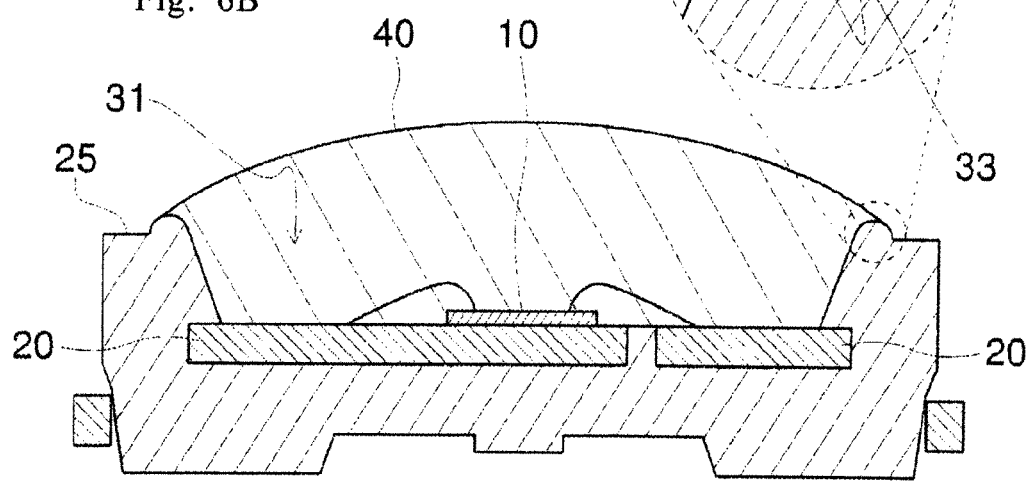

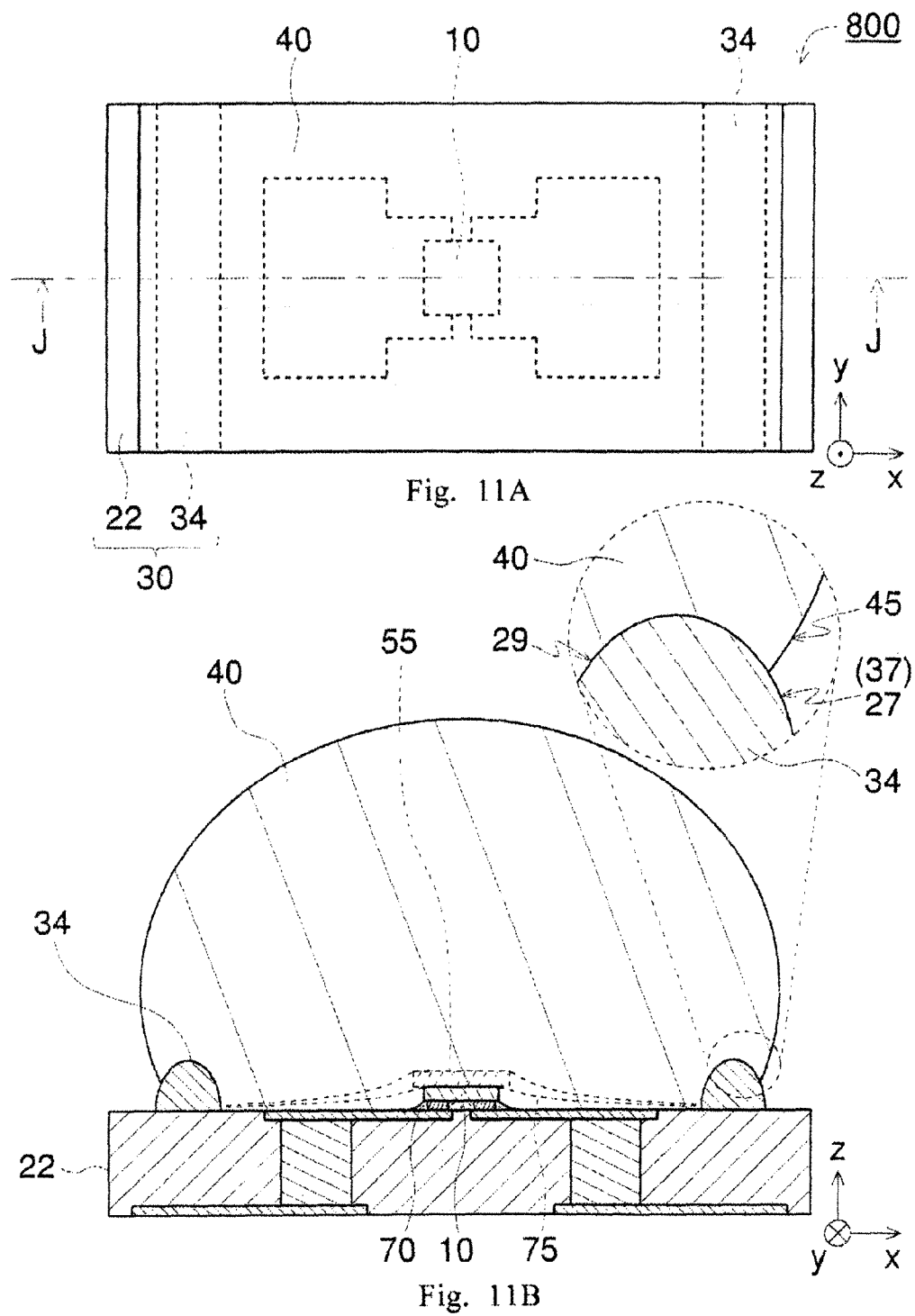

LIGHT EMITTING DEVICE AND METHOD FOR MANUFACTURING THE SAME

CROSS-REFERENCE TO RELATED APPLICATIONS

This application is the U.S. National Phase Entry Application of PCT/JP2012/062418 filed May 15, 2012; which claims priority from Japanese Patent Application No. 2011-109134, filed May 16, 2011; and from Japanese Patent Application No. 2011-163510, filed Jul. 26, 2011. The subject matter of each of the above-referenced applications is hereby incorporated by reference in its entirety.

BACKGROUND

The present invention relates to a light emitting device with a sealing member for sealing a light emitting element, and a method for manufacturing the light emitting device.

Because of its low power consumption and long life, light emitting devices with a light emitting diode (LED) or a laser diode (LD) are expected as a next-generation light source of lamps. For this reason, there is a need for such light emitting devices having higher output and improved luminous efficacy. In order to improve the luminous efficacy of such light emitting devices, one of possible ways is to control the surface shape of its sealing member for sealing a light emitting element.

For example, Patent Document 1 discloses a lighting device, and a method for manufacturing the lighting device. The lighting device is provided with a guard on a flat substrate where a light emitting element is mounted, wherein the guard has one edge on the upper surface, and a sealing resin for sealing the light emitting element is cured as it is held back by the guard.

Further, Patent Document 2 discloses an LED packaging structure, and a method for manufacturing the LED packaging structure. The LED packaging structure includes a plurality of LED chips, an annular light reflector that is formed surrounding the LED chips by application so as to define a resin positioning space, and a convex lens that is housed in the resin positioning space by immersion so as to cover the LED chips, all of which are placed on a wiring substrate, wherein the circumferential surface of the convex lens is in contact with the inner surface of the annular light reflector treated with plasma cleaning, the position and volume of the convex lens is defined by the resin positioning space, the ratio of the weight of the convex lens to the area of the resin positioning area is a predetermined value.

Patent Document 1: JP 2010-003994 A
Patent Document 2: JP 2011-014860 A

DISCLOSURE OF THE INVENTION

Problems to be Solved by the Invention

In general, the light extraction efficiency of a light emitting device tends to become the highest when the surface of its sealing member is formed in a spherical shape approximately centered at a light emitting element. However, in order to control the height of the sealing resin, the lighting device and its manufacturing method disclosed in Patent Document 1 require high processing accuracy to form the edge of the guard. Since such accuracy cannot be achieved by simple methods such as metallic molding, the height of the sealing resin tends to be variable. As a result, the light extraction efficiency of the light emitting device tends to be variable. Meanwhile, in the LED packaging structure and its manufacturing method disclosed in Patent Document 2, the surface shape of the convex lens is limited to a convex shape that makes an angle not more than a material-specific contact angle with the top horizontal surface of the annular light reflector, which results in insufficient light extraction efficiency.

The present invention has been made in view of the above-mentioned circumstances, and an object thereof is to provide a light emitting device having high light extraction efficiency, and a method for manufacturing the light emitting device.

Means for Solving the Problems

A first method for manufacturing a light emitting device according to the present invention, includes: forming a sealing member for sealing a light emitting element on a base body by dropping, the base body including a conductive member for connecting to the light emitting element, and a molding integrally molded with the conductive member; the sealing member being formed such that at least a part of a periphery of the sealing member is located on an outward surface of the conductive member or the molding, the outward surface facing outward in a top view.

A first light emitting device according to the present invention, which is manufactured principally by the first method, includes:
 a light emitting element;
 a base body including a conductive member connected to the light emitting element and a molding integrally molded with the conductive member; and
 a sealing member for sealing the light emitting element, at least a part of a periphery of the sealing member being located on an outward surface of the conductive member or molding, the outward surface facing outward in a top view and making an angle of approximately an contact angle or less to the outward surface or to a tangent plane of the outward surface at a contact point between the outward surface and the periphery of the sealing member.

A second method for manufacturing a light emitting device according to the present invention, includes:
 a first step of forming a protrusion at an outer side of an light emitting element on an upper surface of a wiring substrate on which the light emitting element is mounted; and
 a second step of forming a sealing member for sealing the light emitting element by dropping the sealing member is formed such that at least a part of a periphery of the sealing member is located on an outward surface of the protrusion, the outward surface facing outward in a top view.

A second light emitting device according to the present invention, which is manufactured principally by the second method, includes:
 a light emitting element;
 a wiring substrate having an upper surface on which the light emitting element is mounted including a protrusion located at an outer side of the light emitting element on the upper surface where the light emitting element is mounted; and
 a sealing member for sealing the light emitting element, at least a part of a periphery of the sealing member being located on an outward surface of the protrusion, the outward surface facing outward in a top view, and making an angle of approximately an contact angle or less to the outward surface or to a tangent plane of the outward surface at a contact portion between the outward surface and the periphery of the sealing member.

As used herein, the term "upper surface" refers to the surface of a light emitting device where light emission is observed. Further, the phrase "a horizontal surface of a light emitting device in a top view" refers to a surface perpendicular to a light axis of a light emitting device (the light axis can be defined as an axis perpendicular to an upper surface of a light emitting element or a surface where the light emitting element is mounted).

The term "outward" or "outer side" refers to a direction away from a light emitting element in a top view of a light emitting device. Similarly, the term "inward" or "inner side" refers to a direction toward a light emitting element in a top view of a light emitting device.

The term "outward surface" of a molding, a conductive member or a protrusion means that the normal vector of the surface of the molding, conductive member or protrusion (also referred to as molding etc.) includes an outward component. If an outward surface is curved, the term "outward surface" means that the normal vector of a tangent plane of the surface of the molding, a conductive member or a protrusion at the contact with the periphery of a sealing member includes an outward component.

The term "approximately a contact angle or less" means that an angle is substantially equal to the contact angle or narrower than the contact angle.

In the first and second manufacturing methods of the present invention, the surface of the sealing member is shaped by the action of the surface tension of a fluid sealing member before curing which is in fluidized condition. Accordingly, the lower the wettability of the fluid sealing member to the surface of the molding etc. is (i.e. the broader the contact angle is), the higher the height of the sealing member is (the height basically refers to the distance from the surface where the light emitting element is mounted to the surface of the sealing member along the light axis of the light emitting device). However, according to the present invention, the molding etc. has an outward surface, and since the periphery of the sealing member is positioned on the outward surface, the apparent contact angle can be increased by the inclination angle of the outward surface. As a result, the height of the sealing member can be increased. Furthermore, by adjusting the inclination angle of the outward surface, the height of the sealing member can be precisely adjusted.

The first and second light emitting devices of the present invention can be manufactured by the above manufacturing methods. Therefore, the sealing members of the light emitting devices have small variation in height. Further, since the above manufacturing methods enable adjustment of the height of the sealing member, the light emitting devices can be provided with the sealing member that has a surface shape suitable for enhancing the light extraction efficiency.

Effects of the Invention

According to the manufacturing methods of the light emitting device of the present invention, the surface of the sealing member can be easily formed in a high convex shape, which allows for low-cost manufacture of light emitting devices having high light extraction efficiency. Further, in the light emitting devices of the present invention, the high convex surface of the sealing member improves the usage efficiency of the light toward the front surface of the light emitting devices, resulting in high light extraction efficiency of the light emitting devices.

BRIEF DESCRIPTION OF THE DRAWINGS

FIG. 6A is a schematic top view of a light emitting device according to an embodiment of the present invention, FIG. 6B is a cross sectional views taken along the line D-D of FIG. 6A, and FIG. 6C is a cross sectional views taken along the line E-E of FIG. 6A.

FIG. 11A is a schematic top view of a light emitting device according to an embodiment of the present invention, and FIG. 11B is a schematic cross sectional view taken along the line J-J of FIG. 11A.

MODE FOR CARRYING OUT THE INVENTION

Figure 1A:
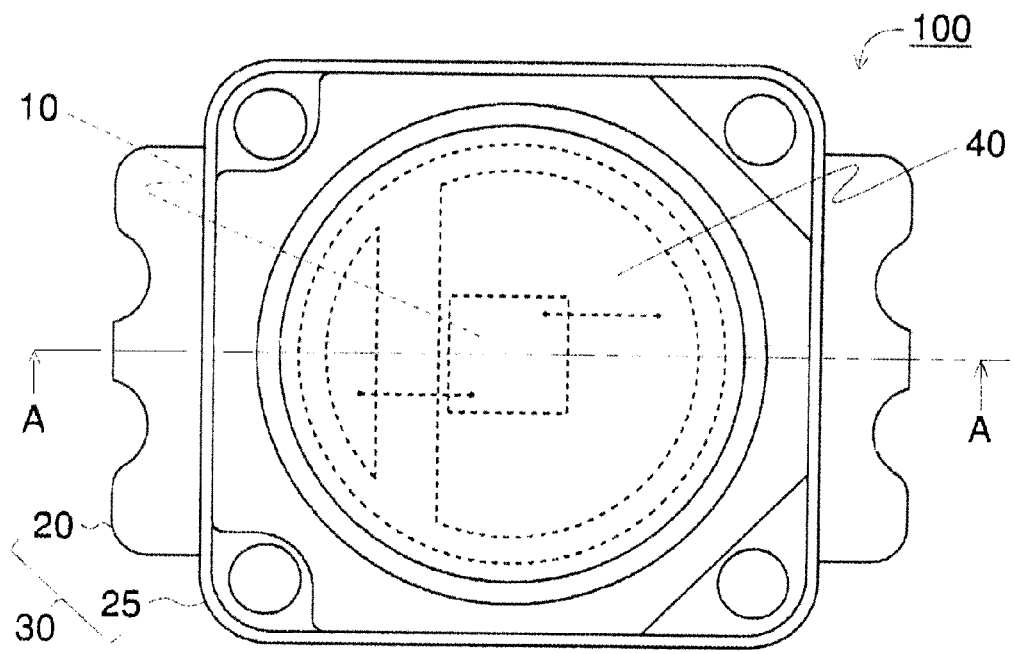
FIG. 1A is a schematic top view of a light emitting device according to an embodiment of the present invention.

Embodiments of the present invention will be described with reference to the accompanying drawings. It is understood that the light emitting devices and the manufacturing methods thereof described below are merely embodiments of the technical idea of the present invention, and the present invention is not limited to the following devices and methods unless otherwise specified. The size, positional relationship and the like of the components illustrated in the drawings may be drawn with some exaggerations for descriptive reasons.

First Embodiment

Figure 1B:
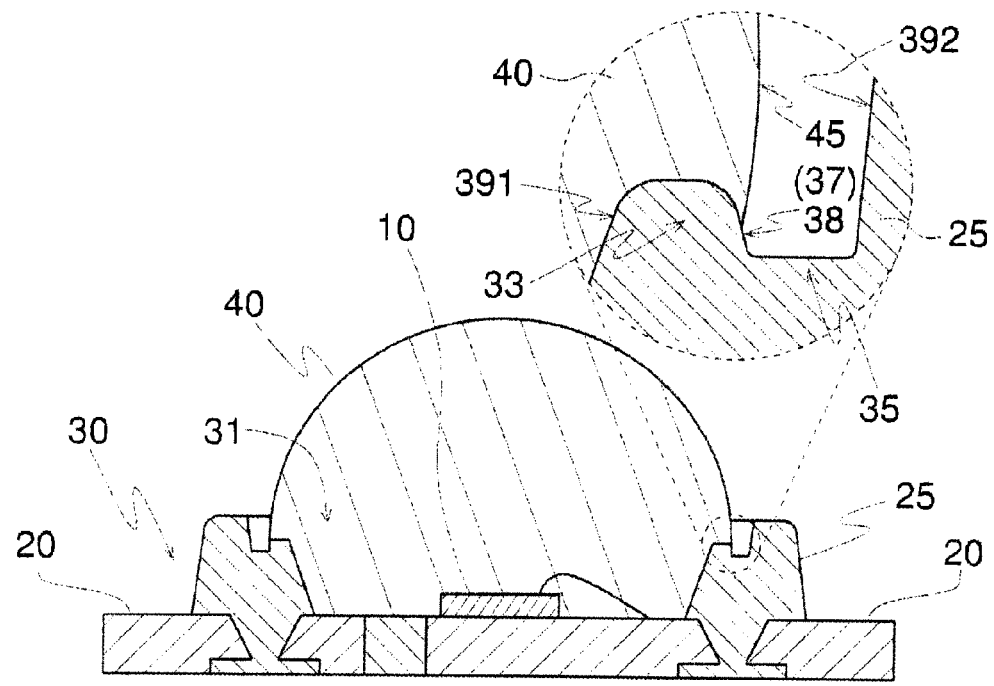
FIG. 1B is a schematic cross sectional view taken along line A-A of FIG. 1A.

FIG. 1A is a schematic top view of a light emitting device according to a first embodiment, and FIG. 1B is a schematic cross sectional view taken along line A-A of FIG. 1A. The light emitting device 100 of FIG. 1 includes a light emitting element 10, a base body 30 including a conductive member 20 that is connected to the light emitting element 10 and a molding 25 that is integrally formed with the conductive member 20, and a sealing member 40 for sealing the light emitting element 10.

In more detail, the base body 30 is a package including the conductive member 20 that is composed of a pair of positive and negative lead frames and the resin molding 25 that is integrally holds the conductive member. The base body 30 has a recess 31 on the upper surface. A part of the bottom surface of the recess 31 is defined by a part of the surface of the conductive member 20. The light emitting element 10 is an LED chip that is pasted on the bottom surface of the recess 31 of the base body by an adhesive (not shown) and is connected to the conductive member 20 by wires. The sealing member 40 is a sealing resin that is provided to cover the light emitting element 10 inside the recess 31 of the base body. The sealing member 40 may contain a phosphor or a diffuser.

As illustrated in FIG. 1B, the surface of the sealing member 40 bulges upward from the base body 30 to be a convex. Hereinafter, the part of the structural surface of the base body 30 from which the surface 45 of the sealing member 40 rises, i.e. where the periphery of the sealing member 40 is positioned, is referred to as "sealer rising surface 37". In the embodiment, at least a part of, preferably all of the sealer rising surface 37 is composed of an outward surface 38 that faces outward in a top view of the base body 30.

FIGS. 2A through 2E are schematic cross sectional views illustrating a method for manufacturing the light emitting device of the first embodiment. The light emitting device 100 of FIG. 1 is manufactured through the following steps. It is understood that the method for manufacturing the light emitting device of the present invention may be any method as long as it involves the step of forming the sealing member on the body where the light emitting element is mounted, and the manufacturing method described below is merely an example.

Figure 2A:
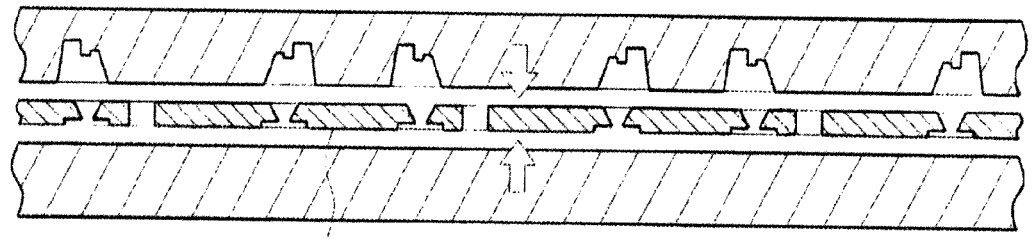
FIGS. 2A-2E illustrate a method for manufacturing a light emitting device according to an embodiment of the present invention, FIG. 2A showing a molding that is molded integrally with a conductive member to form a base body, FIG. 2B showing a light emitting element mounted on the base body, FIG. 2C showing a sealing member in a fluidized condition being dropped on the base body, FIG. 2D showing the sealing member being solidified by heating, cooling or the like, and FIG. 2E showing a plate cut into individual light emitting devices.

First, as illustrated in FIG. 2A, the molding 25 is molded integrally with the conductive member 20, so as to form the base body 30. Specifically, a plate composed of a plurality of the conductive members 20 is sandwiched with upper and lower metal molds having a predetermined shape. To the gap between the metal molds, the fluid material of the molding 25 which is in fluidized condition (liquid, sol or slurry state) is injected, and then solidified. Thereafter, the molding 25 is released from the metal molds. A plurality of base bodies 30 connected to each other are thus obtained.

Figure 2B:
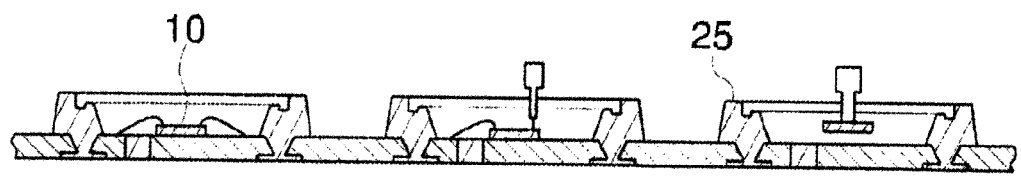

Then, as illustrated in FIG. 2B, the light emitting element 10 is mounted on the base body 30. Specifically, the light emitting element 10 is pasted on the base body 30 by an adhesive, and is further connected to the conductive member 20 by wires.

Figure 2C:
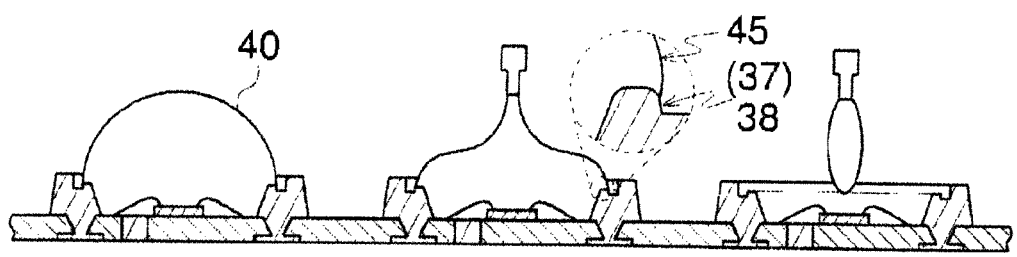
Figure 2D:
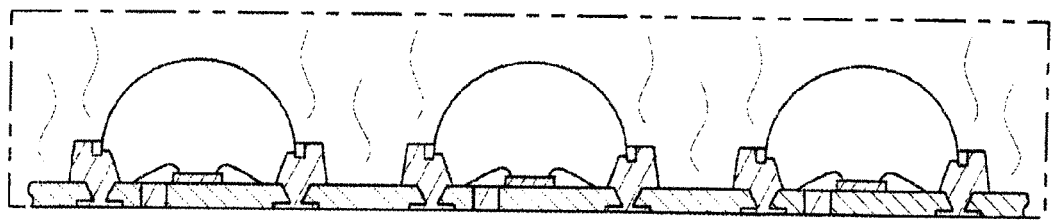

Then, as illustrated in FIGS. 2C and 2D, the sealing member 40 is formed on the base body 30. Particularly in the present invention, the sealing member is formed by a dripping (potting). A dripping method is a low-cost molding method that does not require a molding machine or a metal mold comparing to compression molding, transfer molding, injection molding and cast molding. Specifically, the fluid sealing member 40 which is in fluidized condition (liquid, sol or slurry) is dropped on the base body 40 using a dispenser or the like so as to cover the light emitting element 10. Then, the sealing member 40 is directly solidified by heating, cooling or the like. In this step, the sealing member 40 is formed such that the outward surface 38 serves as at least a part of the sealer rising surface 37. In other words, the sealing member 40 is formed such that at least a part of the surface 45 rises from the outward surface 38 of the body 30.

As mentioned below, the tangent line of the surface 45 of the sealing member 40 (at the contact point between the outward surface 38 and the periphery of the sealing member 40) makes an angle of approximately the contact angle with the outward surface 38. The "contact angle" is dependent on the physical properties of the fluid sealing member 40 before curing and the outward surface 38.

While the sealing member 40 is being cured, the base body 30 may be flipped over, i.e. the upper surface of the base body 30 where the sealing member 40 is dropped may face downward. By doing so, the fluid sealing resin 40 can hang down by gravity while the sealing resin 40 is being cured. As a result, the surface of the sealing member 40 can bulge higher by the action of gravity. In this case, the angle between the tangent line of the surface 45 of the sealing member and the outward surface 38 can be narrower than the contact angle since the sealing resin 40 hangs down by gravity.

Figure 2E:
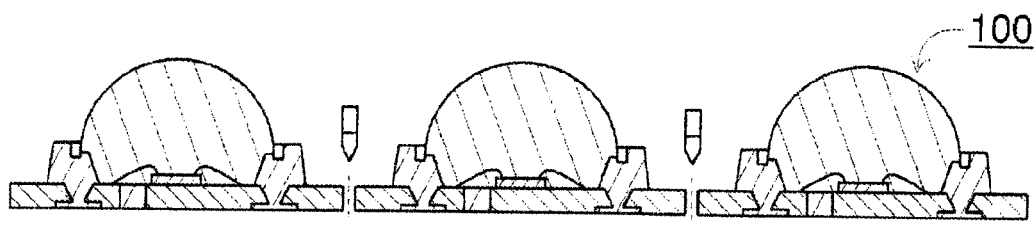

Lastly, as illustrated in FIG. 2E, the plate is cut into individual light emitting devices 100. Alternatively, the plate may be cut into individual base bodies 30 before forming the sealing member 40.

In the lighting device of Patent Document 1, the surface of the sealing resin rises from the upper surface of the guard that is horizontal or elevated from the front side toward the back side along the flow direction of the resin (i.e. the upper surface faces inward). Also, in the LED packaging structure of Patent Document 2, the surface of the convex lens rises from the inner-side surface of the annular light reflector. As mentioned above, a skilled person would generally design the process of forming a sealing member by dropping such that the fluid sealing member does not run out of the guard for holding back the sealing member. However, in such processes, the surface of the sealing member can be only formed in a flat convex, which results in insufficient light extraction efficiency.

In contrast, in the present invention, since the sealing member is formed on the base body in the above-mentioned way, the surface of the sealing member can be formed in a high convex comparatively stably, which results in sufficiently high light extraction efficiency. That is, as a result of diligent study, the present inventors got an idea that the surface of a sealing member rises from the outward surface of a base body, which was contrary to the conventional idea. This was a secret key to achieve comparatively stable molding of the high convex surface of the sealing member, and the present invention was thus made. The principle thereof will be described below.

Figure 3A:
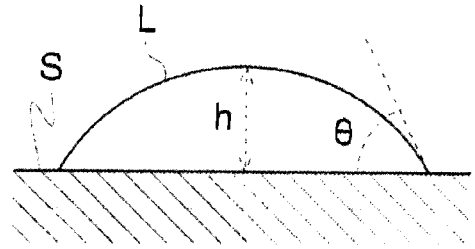
FIGS. 3A-3F illustrate a relationship between the solid surface and the surface shape of a droplet on the surface, FIG. 3A showing a droplet placed on a flat surface of a solid, FIG. 3B showing a situation where the surface of the solid is inclined, FIG. 3C showing a situation in which a surface of a droplet rises from an outward surface of the solid that faces outward, FIG. 3D showing a situation where the surface of the solid is a convex curved surface, FIG. 3E showing a situation where the droplet is located just at an angular edge of the solid, and FIG. 3F showing a situation where the solid has a rounded convex curve at an edge thereof.

FIGS. 3A thorough 3F are schematic cross sectional views for describing a relationship between the solid surface and the surface shape of a droplet on the surface. As illustrated in FIG. 3A, when a droplet L is placed on a flat surface of a solid S, the surface thereof takes a convex curved shape that makes an angle of the contact angle θ (degree) with the surface of the solid S by the action of its surface tension. The contact angle θ is defined as the angle between the tangent line of the surface of the droplet L and the surface of the solid S at the contact point between the surface (periphery) of the droplet L and the solid S (the angle at the side including the droplet L). The contact angle θ is determined by the surface tensions of the materials of the droplet L and solid S. That is, any certain combination of a solid S and droplet L has its intrinsic contact angle.

The surface tension γL of the droplet L, the surface tension γS of the solid S and the interfacial tension γSL between the droplet L and the solid S satisfy the following equation (Young's equation).

$$\gamma_S = \gamma_{SL} + \gamma_L \cos\theta \text{ or } \cos\theta = \frac{\gamma_S - \gamma_{SL}}{\gamma_L} \qquad \text{[Equation 1]}$$

Figure 3B:
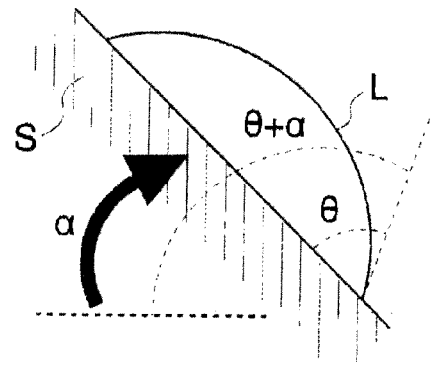
Figure 3C:
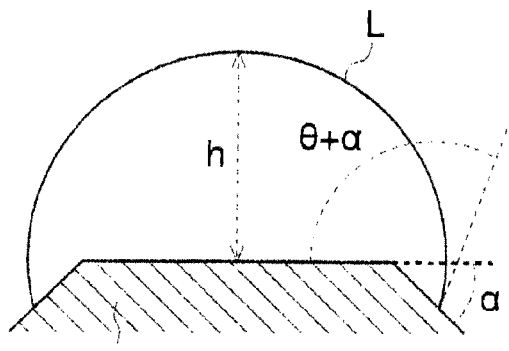
Figure 3D:
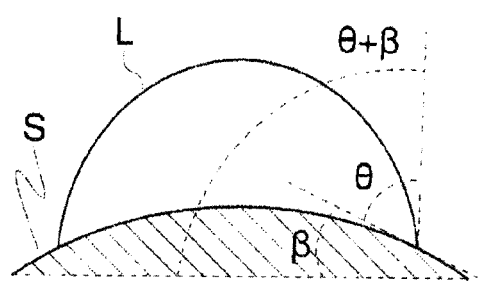

As a way to increase the height h of the droplet L, consider a situation where the surface of the solid S is inclined at an angle of α (degree) relative to the horizontal plane as illustrated in FIG. 3B. In this situation, the droplet L retains the contact angle of approximately θ relative to the inclined surface of the solid S, while an apparent contact angle relative to the horizontal plane becomes approximately θ+α. Accordingly, if the surface of the droplet L rises from an outward surface of the solid S that faces outward in a top view as illustrated in FIG. 3C, it becomes possible to increase the height h of the droplet L. If the surface of the solid S is a convex curved surface as illustrated in FIG. 3D, a plane (also referred to as "tangent plane") that is in contact with the surface of the solid S at the contact point between the solid S and the periphery of the droplet L can be regarded as the reference surface. In the illustrated example, since the tangent plane is inclined at an angle of β (degree) relative to the horizontal plane, the apparent contact angle of the droplet L becomes approximately θ+β relative to the horizontal plane.

Figure 3E:
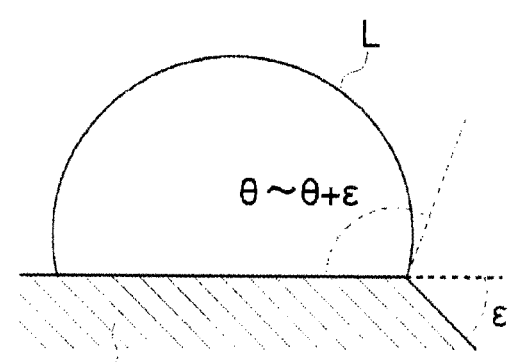
Figure 3F:
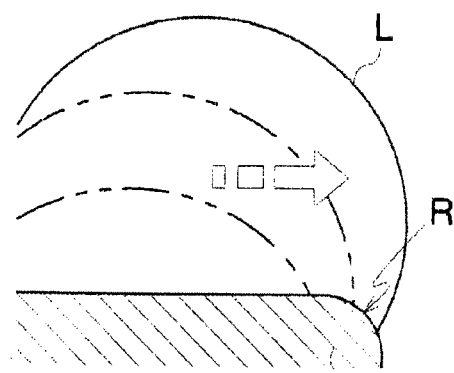

If the droplet L is located just at an angular edge of the solid S as illustrated in FIG. 3E, the droplet L sometimes cannot cross over the edge until its actual contact angle with the horizontal upper surface of the solid S reaches the sum of the intrinsic contact angle θ and the down slope angle c (degree) of the outward surface of the edge (inclination angle relative to the upper surface), which is called the "pinning effect of wetting". In this case, the droplet L can make any contact angle between θ and θ+∈. Accordingly, this "pinning effect of wetting" can be utilized to increase the height of the droplet L. However, since the droplet L is comparatively unstable in such condition, controlling the height of the droplet L by use of this effect results in broad variation of the height. Furthermore, controlling the height of the droplet L by use of this effect requires high processing accuracy of the edge as mentioned above. In contrast, in the case as illustrated in FIG. 3C where the surface of the droplet L rises from the outward surface of the solid S, the droplet L is comparatively stable since it makes an angle of approximately the intrinsic contact angle θ with the outward surface of the solid S, which allows for stable duplication of a desired height. If the solid S has a rounded convex curve R at an edge thereof as illustrated in FIG. 3F, such gradual transit from the upper surface to the outward surface of the solid S suppresses the "pinning effect of wetting", which allows for smooth transfer of the droplet L to the outward surface.

If the droplet L is made of the fluid sealing member 40 before curing and the solid S is the base body 30 as mentioned above, the contact angle θ of the sealing member 40 is determined by the surface tension of the sealing member 40, the surface tension of the base body 30 on which the periphery of the sealing member 40 is positioned, and the interfacial tension between the sealing member 40 and the base body 30. In this case, by placing the periphery of the sealing member 40 on the outward surface 38, it becomes possible to increase the angle of the tangent line of the surface 45 of the sealing member (at the contact point between the outward surface 38 and the periphery of the sealing member) relative to the horizontal plane over the contact angle θ, although the angle of the tangent line of the surface 45 of the sealing member relative to the outward surface 38 remains approximately the contact angle θ. That is, if the sealing member 40 is formed such that the outward surface 38 serves as at least a part of the sealer rising surface 37, the surface 45 of the sealing member easily rises from the outward surface 38 in the vertical direction. This facilitates forming the surface of the sealing member 40 in a high convex shape, preferably a convex curved shape, more preferably an approximate spherical shape. Furthermore, such surface shapes can be duplicated stably. As a result, light emitting devices having high light extraction efficiency can be manufactured at low cost.

Further, in order to form the high convex surface of the sealing member, a low-surface tension coating may be provided on the entire upper surface of the base body before dropping the sealing member. However, since the coating is present on the entire interface between the base body and the sealing member in this case, it may largely degrade the adhesion between the base body and the sealing member. In contrast, in the embodiment, the sealing member is basically in direct contact with the surface of the base body. This produces strong adhesion between the base body and the sealing member, and thereby offers high reliability of the light emitting device. In particular, since the surface of the sealing member rises from the outward surface of the base body, the outward surface act to lock the periphery of the sealing member on the base body, which further enhances the adhesion between the base body and the sealing member.

In the followings, preferred embodiments of the base body 30 and the sealing member 40 will be described in detail.

In the light emitting element 100 of FIG. 1, the base body 30 is provided with a protrusion 33. In addition to the protrusion 33, the base body 30 of this embodiment is particularly provided with a groove 35. In other words, the protrusion 33 is defined by the groove 35. Since the base body 30 has the protrusion 33 or the groove 35, the outward surface 38 can be positioned at the inner side of an end face of an outmost of the base body 30. Then, at least a part of the surface 45 of the sealing member can rise from the outward surface 38 of the protrusion 33 or the groove 35. This prevents the sealing member 40 from leaking out of the base body 30, and facilitates stably forming the surface 45 of the sealing member into a high convex at the inner side of the end face of the outmost of the base body 30. Furthermore, this also prevents the exposed part of the conductive member 20, which serves as an external connector, from being contaminated by the leaked sealing member 40. Thus, it is preferred that the base body is provided with the protrusion or the groove and the outward surface of the protrusion or the groove serves as at least a part of the sealer rising surface. If the base body includes both the protrusion and the groove, the protrusion and the groove may be separated from each other. Further, the protrusion or the groove of the base body may be omitted, and the outward surface which is the end face of the outmost of the base body may serve as all of or at least a part of the sealer rising face.

In the light emitting device 100 of FIG. 1, the outward surface 38 of the protrusion 33 or the groove 35 is lower-side surface continuing from a convex curved surface. Now, consider a situation when the fluid sealing member dropped on the base body is just reaching the edge between the outward surface and the surface continuing from its upper side. If the outward surface is a flat plane that inflects against the surface continuing from the upper side of the outward surface, the sealing member is once accumulated on the surface continuing from the upper side of the outward surface by the action of the above-mentioned "pinning effect of wetting". Then, when the sealing member crosses over the edge, it radically flows due to its own weight and may break its surface shape. However, since the outward surface of the base body includes a convex curved surface at the top part, it suppresses the "pinning effect of wetting" as mentioned above and leads the sealing member smoothly to the outward surface. This facilitates stably forming the high convex surface of the sealing member 40. In this case, either the convex curved surface or a surface continuing from the lower side of the convex curved surface of the outward surface 38 may serve as at least a part of the sealer rising surface 37. Thus, it is preferred that the outward surface 38 is the convex curved surface, or the lower-side surface continuing from the convex curved surface. If the outward surface 38 is defined by the molding 25, the convex curved surface at the top part of the outward surface 38 can prevent the molding 25 from biting to a metal mold to cause chipping, which results in improved moldability of the molding 25.

As mentioned above, the broader the inclination angle (α) of the outward surface 38 relative to the approximately horizontal upper surface of the base body 30 is, the higher the surface of the sealing member 40 can bulge. However, if the base body 30 is molded by using a metal mold, it is preferred that the inclination angle (α) of the outward surface 38 is not more than 90 degrees in view of the releasability of the base body 30 from the metal mold. Thus, the inclination angle (α) of the outward surface 38 that serves as the sealer rising surface 37 is preferably 45 to 90 degrees, more preferably 70 to 90 degrees.

In the light emitting device 100 of FIG. 1, at least a part of the inward surface 391 of the protrusion 33 facing inward in a top view of the base body includes a convex curved surface at the top part thereof. Now, consider a situation when the fluid sealing member dropped on the base body is reaching the edge between the inward surface of the base body and a surface continuing from the upper side of the inward surface. If the inward surface is a flat plane that inflects against the surface continuing from the upper side of the inward surface, the sealing member is once accumulated on the inward surface by the action of the above-mentioned "pinning effect of wetting". Then, when the sealing member crosses over the edge, it radically flows due to its own weight and may break its surface shape. However, since the inward surface 391 of the base body 30 includes a convex curved surface at the top part, it suppresses the "pinning effect of wetting" as mentioned above and leads the sealing member 40 smoothly to the surface continuing from its upper side and further to the outward surface 38. This facilitates stably forming the high convex surface of the sealing member 40. Thus, in the structural surface of the base body 30, it is preferred that a convex curved surface is formed at the top part of all of or at least a part of the inward surface 391 that is located at the inner side of the sealer rising surface 37 and surfaces inward in a top view of the base body.

In the light emitting device 100 of FIG. 1, the protrusion 33 and the groove 35 have an exact circular shape in a top view of the base body 30, and surround the light emitting element 10. The protrusion 33 or the groove 35 serves to provide the outward surface 38 where the surface 45 of the sealing member rises, and also serves as a barrier to hold back the fluid sealing member 40. For this reason, it is preferred that the protrusion or the groove is formed in a frame shape that surrounds the light emitting element. With the frame shape, the protrusion 33 or the groove 35 easily holds back the sealing member 40 and increases the proportion of the outward surface 38 of the protrusion 33 or the groove 35 in the sealer rising surface 37, which facilitates forming the high convex surface of the sealing member 40. Furthermore, the surface 45 of the sealing member tends to be formed so as to bridge between protrusions or grooves, which results in improved symmetry of the surface shape of the sealing member 40. In particular, it is preferred that the protrusion 33 or the groove 35 is formed in a loop shape in a top view of the base body 30, more preferably an oval shape, yet more preferably exact circular shape. This allows for less distortion of the convex surface of the sealing member 40, which makes it easier to improve the light extraction efficiency and allows for highly symmetrical light distribution. Further, it is preferred that the protrusion 33 or the groove 35 is approximately centered on the light emitting element 10, because this improves the symmetry of the light distribution. As the barrier to hold back the fluid sealing member, the protrusion is preferred to the groove.

In the light emitting device 100 of FIG. 1, the base body 30 has a recess 31, and the protrusion 33 and the groove 35 are placed inside the recess 31. The sealing member 40 is also placed inside the recess 31. Thus, it is preferred that the base body has a recess in which the light emitting element is mounted, and the sealer rising surface is located inside the recess. The recess 31 of the base body 30 prevents the sealing member 40 from flowing out of the base body 30, which facilitates forming the sealing member 40 in the recess 31. Further, providing the sealing member 40 inside the recess 31 can reduce the size of the device. The molding 25 that defines the recess 31 serves as a barrier to protect the sealing member 40 from damages due to external force and contamination by dust. Furthermore, the inner wall surface of the recess 31 serves as a reflecting mirror that reflects the light emitted from the light emitting element 10 toward the front surface of the device (upward from the base body 30), which results in enhanced front light intensity of the light emitting device. In particular, these advantageous effects are remarkable when the surface of the sealing member is entirely positioned inside the top surface with the opening of the recess.

In the light emitting device 100 of FIG. 1, at least a part of the sealer rising surface 37 is located on the outward surface 38 of the groove 35. The groove 35 has an inward surface 392 being opposed to the outward surface 38. In the embodiment, the inward surface 392 can also be regarded as a part of the inner wall surface of the recess 31. Thus, it is preferred that the base body has an inward surface that faces inward in a top view of the base body, and the inward surface is placed at the outer side of the outward surface on which the sealer rising surface is located. The inward surface 392 and/or the bottom surface between the inward surface and the outward surface 38 can reflect the light emitted from the periphery of the sealing member 40 on the outward surface 38 of the base body 30 toward the front surface of the device so that the light is effectively extracted. It is particularly preferred that the inward surface 392 which is opposed to the outward surface 38 on which at least a part of the sealer rising surface 37 is located is inclined or curved to spread upward. This shape can effectively reflect the light emitted from the periphery of the sealing member 40 on the outward surface 38 of the base body 30 toward the front surface of the device. This shape is also preferred in terms of the above-mentioned releasability of the base body 30 from a metal mold. Further, it is preferred that the inward surface 392, which is opposed to the outward surface 38 that serves as the sealer rising surface 37, has approximately the same height as, more preferably higher than the outward surface 38. This shape can easily reflect the light emitting from the periphery of the sealing member 40 on the outward surface 38 of the base body 30 toward the front surface of the device. However, it is practically difficult to form such inward surface 392 if the sealing member is molded by using a molding machine or a metal mold because it interferes with the molding machine or metal mold.

Second Embodiment

Figure 4A:
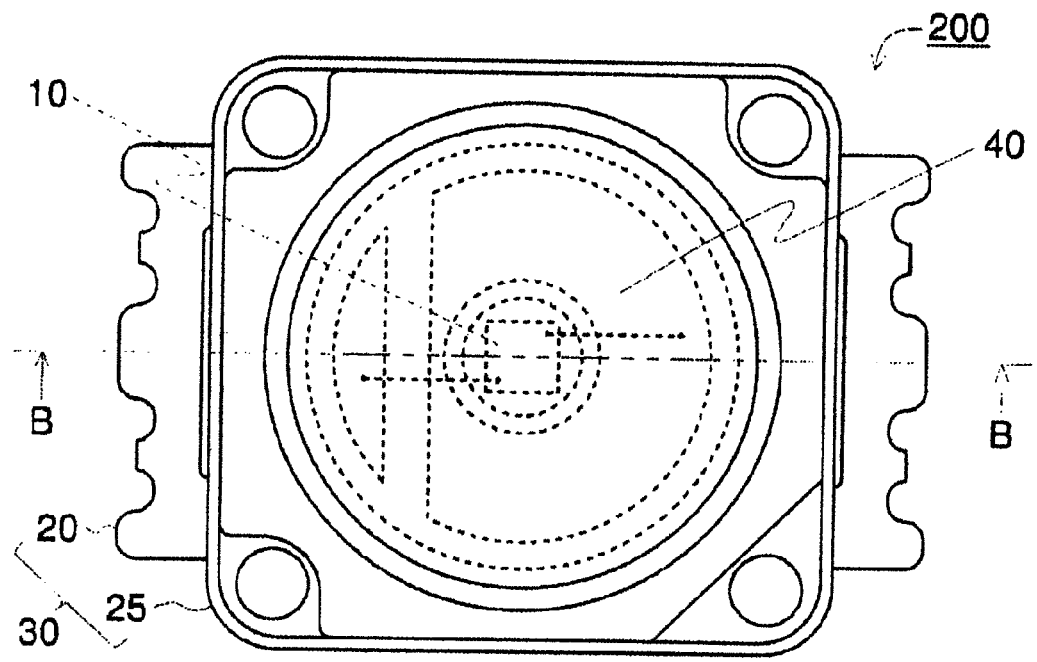
FIG. 4A is a schematic top view of a light emitting device according to an embodiment of the present invention.
Figure 4B:
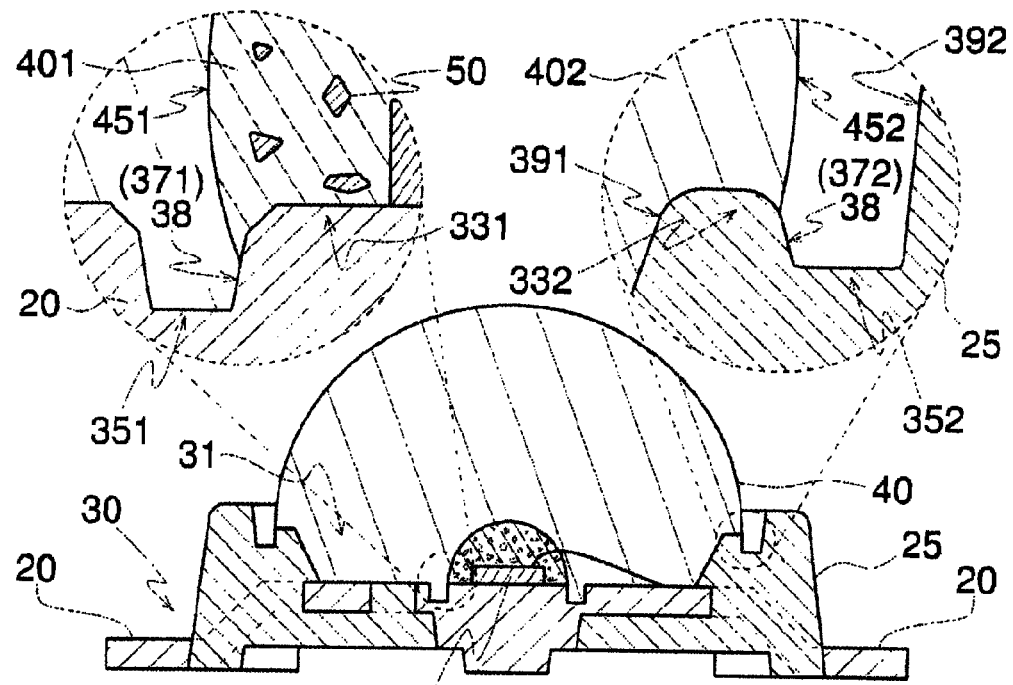
FIG. 4B is a schematic cross sectional view taken along the line B-B in FIG. 4A.

FIG. 4A is a schematic top view of a light emitting device according to a second embodiment, and FIG. 4B is a schematic cross sectional view taken along line B-B of FIG. 4A. The light emitting device 200 of FIG. 4 includes a light emitting element 10, a base body 30 including a conductive member 20 connected to the light emitting element 10 and a molding 25 integrally molded with the conductive member 20, and a sealing member 40 for sealing the light emitting element 10.

In more detail, the base body 30 is a package including the conductive member 20 that is composed of a pair of positive and negative lead frames and the resin molding 25 that integrally holds the conductive member. The base body 30 has a recess 31 on the top side. A part of the bottom surface of the recess 31 is defined by a part of the surface of the conductive member 20. The light emitting element 10 is an LED chip that is pasted on the bottom surface of the recess 31 of the base body by an adhesive (not shown) and is connected to the conductive member 20 by wires. The sealing member 40 is a sealing resin that is provided inside the recess 31 of the base body to cover the light emitting element 10.

In the light emitting device 200 of FIG. 4, the base body 30 is provided with a first protrusion 331 and a second protrusion 332 placed at the outer side of the first protrusion 331. In addition to these protrusions, the base body 30 of the embodiment is particularly provided with a first groove 351 and a second groove 352 placed at the outer side of the first groove 351. In other words, the first and second protrusions are defined by the first and second grooves respectively. Thus, it is preferred that the base body is provided with the first protrusion or the first groove and the second protrusion or the second groove at the outer side of the first protrusion or groove, and the outward surface of any of the first and second protrusions and the first and second grooves serves as at least a part of the sealer rising surface. Since the base body 30 is provided with a plurality of protrusions 331 and 332 or a plurality of grooves 351 and 352, a plurality of outward surfaces 38 are defined at the inner side of the outermost end face of the base body 30. Then, at least a part of the surface 45 of the sealing member can rise from the outward surface 38 of any of the protrusions 331 and 332 and the grooves 351 and 352. This offers options of the outward surface 38 that serves as the sealer rising surface when the sealing member 40 is formed on the base body 30 by dropping, and thereby the size of the sealing member 40 can be adjusted while the surface of the sealing member 40 is formed in a high convex. Further, it is preferred that the first protrusion 331 or the first groove 351 is positioned at the inner side of wire connection parts of the conductive member 20 to which the wires are connected. This prevents the wire connection parts of the conductive member 20 from being contaminated by the leaked adhesive of the light emitting element 10, and thereby can prevent poor connection of the wires. The first protrusion 331 or the first groove 351 may be provided to the conductive member 20 by press molding, metallic molding or the like.

In the light emitting device 200 of FIG. 4, the sealing member 40 includes a first sealing portion 401 for sealing the light emitting element 10 and a second sealing portion 402 for sealing the first sealing portion 401. The first sealing portion 401 is formed such that in the structural surface of the base body 30, the outward surface 38 of the first protrusion 331 or the first groove 351 serves as at least a part of a first sealer rising surface 371 from which the surface 451 of the first sealing portion rises. The second sealing portion 402 is formed such that in the structural surface of the base body 30, the outward surface 38 of the second protrusion 332 or the second groove 352 serves as at least a part of a second sealer rising surface 372 from which the surface 452 of the second sealing portion rises. With this structure, the surface of each sealing portion (layer) can be formed in high convex comparatively stably, although the sealing member 40 is formed through a plurality of separate steps. As a result, light reflection on the interface between the two sealing portions can be suppressed, which makes it easier to improve the light extraction efficiency. The sealing portions may be made of the same material and accordingly have the same refractive index. However, if the refractive indexes of the sealing portions come close to the refractive index of the air in a stepwise fashion, such structure can not only efficiently extract the light from the light emitting element 10 into the sealing member 40 but also suppress light reflection on the interface between the two sealing portions, which results in further improved light extraction efficiency. Thus, it is preferred that the second sealing portion 402 has lower refractive index than the first sealing portion 401. The second sealing portion 402 may be formed after the first sealing portion 401 is completely cured. However, forming the second sealing portion 402 on the uncured or half-cured first sealing portion 401 can enhance the adhesion between the first sealing portion 401 and the second sealing portion 402. Further, since the first sealing portion 401 is an inner region of the sealing member 40, it may be formed by use of the above-mentioned "pinning effect of wetting". In this case, the surface 451 of the first sealing portion 401 rises from an end edge of the upper surface, i.e. the boundary with the outward surface 38 of the first protrusion 331 or the first groove 351 of the base body 30. As for the inward surface of the groove 351 that is opposed to the outward surface 38, the above-mentioned preferred features of the inward surface 392 may be employed for the first sealing portion 401.

In the light emitting device 200 of FIG. 4, the sealing member 40 contains a phosphor 50 only in the first sealing portion 401. The phosphor 50 is excited by the light emitted from the light emitting element 10. Because the wavelength conversion and diffusion by the phosphor 50 occur only inside the first sealing portion 401, i.e. in the vicinity of the light emitting element 10 in the sealing member 40, this structure allows for smaller size of the light source with respect to the surface of the sealing member compared to a device with a phosphor dispersed approximately all over the sealing member 40, which results in improved light extraction efficiency. Furthermore, since the surface of the first sealing portion 401 can be formed in a high convex in this embodiment, the first sealing portion 401 has small variation in light path length in different directions, which allows for the light emission with approximately uniform chromaticity despite the phosphor 50 dispersed in the first sealing portion 401. In the first sealing portion 401, the phosphor 50 may be deposited or a dispersant may be contained.

In the light emitting device 200 of FIG. 4, the outward surface 38 of the first protrusion 331 or the first groove 351 includes a flat surface at the top part. While it is the most preferred that the outward surface 38 includes a convex curved surface at the top part in order to suppress the "pinning effect of wetting" as mentioned above, the top part may also be a flat surface that makes a descending slope (inclination angle) of preferably 45 degrees or less, more preferably 30 degrees or less with an upper flat surface continuing from the outward surface. This makes a comparatively blunt edge between the adjacent two flat surfaces, and thereby suppresses accumulation of the sealing member 40 by the action of the "pinning effect of wetting". As a result, the sealing member 40 is comparatively smoothly led to the outward surface 38. As used herein, "the upper flat surface continuing from the outward surface" may be either approximately horizontal upper surface or outward surface of the base body 30. That is, the outward surface 38 may be composed of a plurality of flat surfaces, a lower flat surface of which makes a descending slope of preferably 45 degrees or less, more preferably 30 degrees or less to an upper flat surface thereof.

Third Embodiment

Figure 5A:
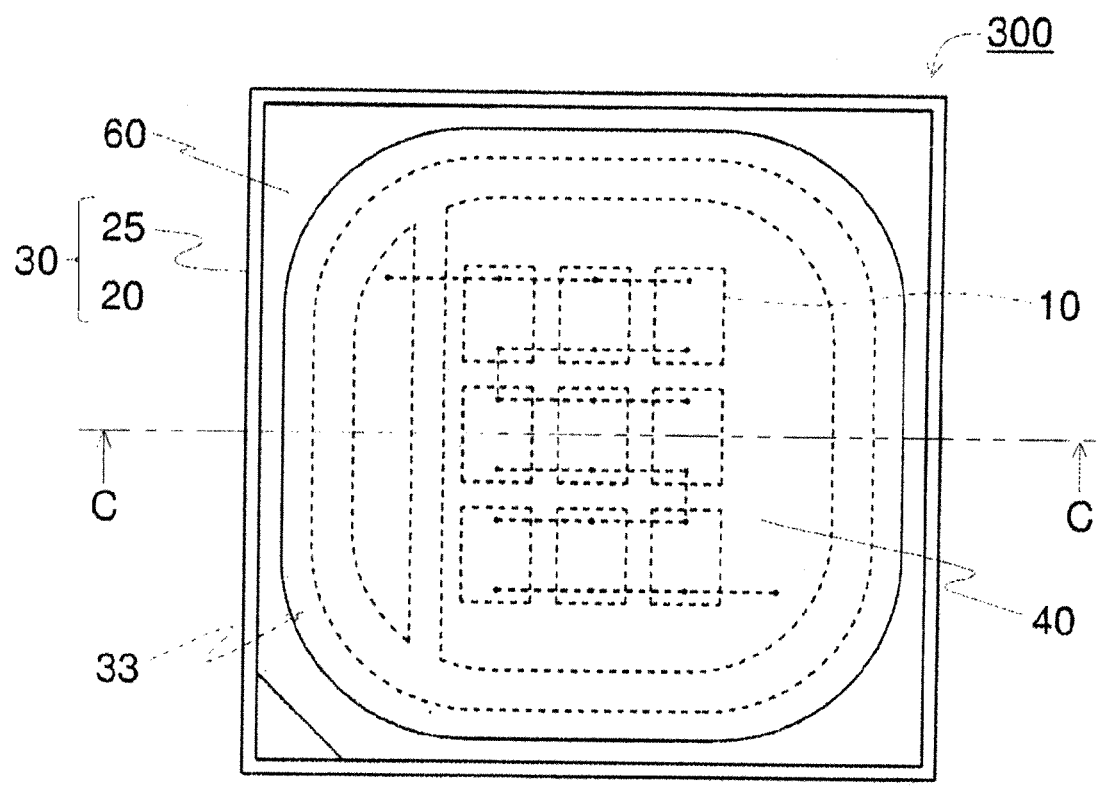
FIG. 5A is a schematic top view of a light emitting device according to an embodiment of the present invention.
Figure 5B:
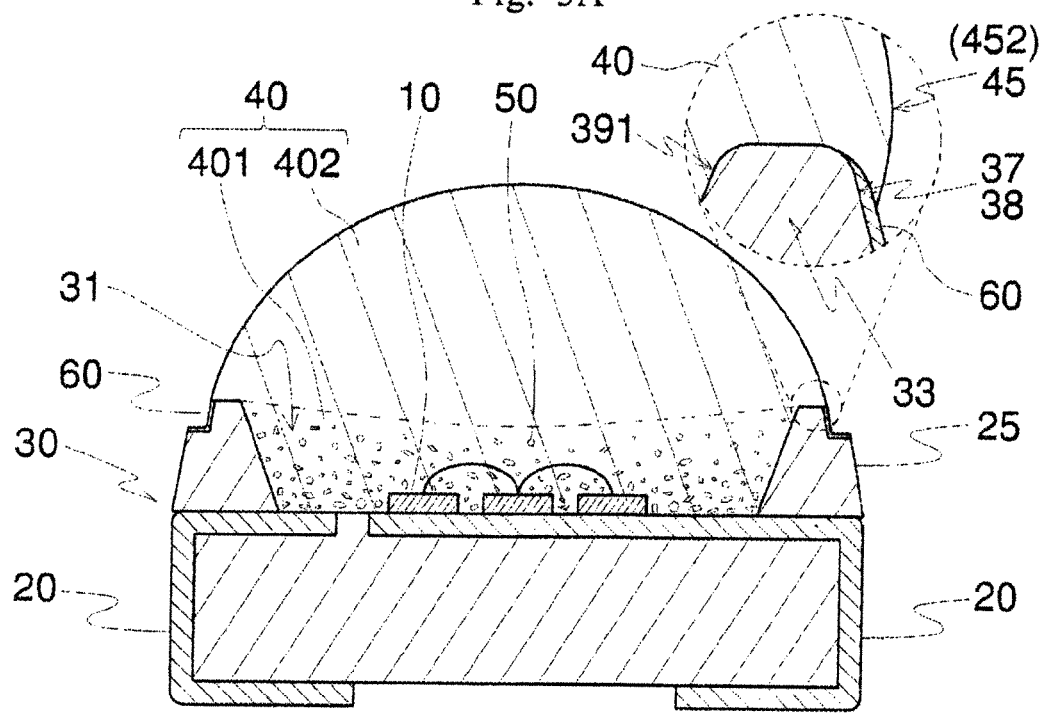
FIG. 5B is a schematic cross sectional view taken along the line C-C of FIG. 5A.

FIG. 5A is a schematic top view of a light emitting device according to a third embodiment, and FIG. 5B is a schematic cross sectional view taken along line C-C of FIG. 5A. The light emitting device 300 of FIG. 5 includes light emitting elements 10, a base body 30 including a conductive member 20 connected to the light emitting elements 10 and a molding 25 integrally molded with the conductive member 20, and a sealing member 40 for sealing the light emitting element 10.

In more detail, the base body 30 is a package including the conductive member 20 that is composed of a pair of positive and negative lead frames and the resin molding 25 that integrally holds the conductive member. The base body 30 has a recess 31 on the upper surface. A part of the bottom surface of the recess 31 is defined by a part of the surface of the conductive member 20. The light emitting elements 10 are a plurality of LED chips that are pasted on the bottom surface of the recess 31 of the base body by an adhesive (not shown), and are connected to the conductive member 20 by wires. The sealing member 40 is a sealing resin provided on the base body 30 to cover the light emitting elements 10.

In the light emitting device 300 of FIG. 5, the base body 30 is provided with a protrusion 33 placed at the outer side of the recess 31. The protrusion 33 or a groove at the outer side of the recess 31 allows for a larger sealing member 40 whose sealer rising surface 37 is at least partially composed of an outward surface 38 of the protrusion or the groove, which makes it easier to improve the light extraction efficiency. Furthermore, this structure allows for a simple shape and a large opening of the recess 31 so that the entire inner wall surface can serve as a reflecting mirror, which makes it easier to improve the light extraction efficiency. As a result, high light extraction efficiency can be easily achieved even if the light source is comparatively large or if the base body is comparatively small. Particularly in the embodiment, the sealing member 40 is formed through two separate steps, and contains a phosphor 50 only in the lower layer, i.e. a first sealing portion 401. The phosphor 50 is excited by the light emitted from the light emitting element 10. The first sealing portion 401 covers all of the light emitting elements 10, and fills the recess 31 up to approximately the upper opening plane thereof. This allows the first sealing portion 401 to serve as a surface light source. The first sealing portion 401 may contain a dispersant. Meanwhile, the upper layer, i.e. a second sealing portion 402, is formed such that the outward surface 38 of the protrusion 33 serves as at least a part of its sealer rising surface 37, and thereby having a high convex surface 45 (452). This allows for high luminous flux of the light emitting device.

In the light emitting device 300 of FIG. 5, the protrusion 33 is placed along the periphery of the recess 31, and has a rounded square frame shape in a top view of the base body 30. In a top view of the base body, it is preferred that the protrusion or the groove is rounded at least at the corners or at the entire part such as an exact circular shape as illustrated in the first and second embodiments. If the protrusion or the groove has sharp corners in a top view of the base body, they cause distortion of the surface of the sealing member around the corners. However, by rounding at least the corners of the protrusion 33 or the groove in a top view of the base body 30, the surface of the sealing member 40 can be formed in a comparatively smooth convex shape while occurrence of such distortion is suppressed, which makes it easier to improve the light extraction efficiency. The protrusion or the groove is not necessarily placed along the periphery of the recess in a top view of the base body. For example, a ring protrusion or groove may be provided around a rectangular recess.

In the light emitting device 300 of FIG. 5, a coating 60 having a critical surface tension of 50 mN/m or less is formed only on the outward surface 38 of the base body 30 that serves as the sealer rising surface 37 and on the structural surface at the outer side of the outward surface 38. When the fluid sealing member 40 is shaped as illustrated in FIG. 2C, the smaller the surface tension of the outward surface 37 (solid S of FIG. 3) of the base body (the molding 25 in FIG. 2) is, the broader the contact angle of the sealing member 40 (the contact angle θ of the droplet L of FIG. 3) is. To take advantage of this, the coating having a smaller surface tension is formed only on the outward surface of the base body that serves as the sealer rising surface, or only on the outward surface of the base body that serves as the sealer rising surface and on the structural surface at the outer side of the outward surface before the sealing member is dropped on the base body. With this structure, the surface of the sealing member can rise from the outward surface more easily. As a result, this facilitates forming the high convex surface of the sealing member 40, which makes it easier to improve the light extraction efficiency. Further, by limiting the area of the coating 60 as mentioned above, the sealing member 40 is in direct contact with the surface of the base body 30 at the inner side of the outward surface 38, which provides strong adhesion between the base body 30 and the sealing member 40. It is preferred that the molding 25 is made of a material having a critical surface tension of more than 50 mN/m, because it requires high cohesive force to ensure solder heat resistance and high adhesion to the sealing member 40. Thus, it is preferred that the coating 60 is made of a material having a critical surface tension of 50 mN/m or less. Exemplary materials of the coating 60 include fluororesins, silicone materials, and the like. Among them, silicone oil is preferred since it is absorbed into the sealing member during its curing process and causes less degradation of the adhesion with the base body.

Fourth Embodiment

FIG. 6A is a schematic top view of a light emitting device according to a fourth embodiment, and FIGS. 6B and 6C are schematic cross sectional views taken along line D-D and line E-E of FIG. 6A. The light emitting device 400 of FIG. 6 includes a light emitting element 10, a base body 30 including a conductive member 20 connected to the light emitting element 10 and a molding 25 integrally molded with the conductive member 20, and a sealing member 40 for sealing the light emitting element 10.

In more detail, the base body 30 is a package including the conductive member 20 that is composed of a pair of positive and negative lead frames and the resin molding 25 that integrally holds the conductive member. The base body 30 has a recess 31 on the upper surface. A part of the bottom surface of the recess 31 is defined by a part of the surface of the conductive member 20. The conductive member 20 includes terminals for external connection that extend out on an end face of the molding 25. The light emitting element 10 is an LED chip that is pasted on the bottom surface of the recess 31 of the base body by an adhesive (not shown), and is connected to the conductive member 20 by wires. The sealing member 40 is a sealing resin that is provided on the base body 30 to cover the light emitting element 10.

The above-mentioned light emitting devices of the first to third embodiments have a mounting surface on the lower surface (back surface) of the base body 30. In contrast, the light emitting device 400 of FIG. 6 has a mounting surface on an end face (side surface) of the base body 30. In the mounted position, the direction approximately perpendicular to the end face of the mounting surface (the y-direction in the figure) corresponds to the thickness (height) direction. For example, the light emitting device 400 of such type is used for a backlight light source of liquid crystal displays, and is installed on the side of a light guide panel. In order to make the device thinner, the shape of the base body 30 is shorter in height and longer in width in a top view, and a recess 31 has a similar shape accordingly. Further, in order to increase the light extraction efficiency, it is required the recess 31 has a large opening. For this reason, there are little spaces for forming a protrusion or a groove at the top and bottom sides of the peripheral part of the recess 31 of the base body 30. However, there are enough spaces for forming a protrusion or a groove at the lateral sides (in the x-direction in the figure) of the peripheral part of the recess 31 of the base body 30, i.e. on the left and right sides of the recess 31. For this reason, the light emitting device 400 of the embodiment is provided with linear protrusions 33 that extend in the height direction and are placed on the left and right sides of the recess 31 in a top view of the base body 30. Then, the sealing member 40 is formed such that the outward surface 38 of the protrusions 33 serves as at least a part of its sealer rising surface 37. As a result, the surface of the sealing member 40 can be formed in a high convex shape at least in the lateral direction, which results in improved light extraction efficiency.

As mentioned above, a protrusion or a groove may also have a strip shape beside a frame shape. This facilitates reducing the size of a protrusion or a groove, and thereby facilitates providing an outward surface in a smaller area at the inner side of the outermost end faces of the base body. In this case, it is preferred that at least two protrusions or grooves are provided to sandwich the light emitting element. With this structure, the surface of the sealing member tends to be formed so as to bridge between the protrusions or the grooves, which results in improved symmetry of the surface shape of the sealing member. Further, a plurality of protrusions or grooves may be provided separately from each other in a shape like a dotted line, or may be scattered.

Fifth Embodiment

Figure 7A:
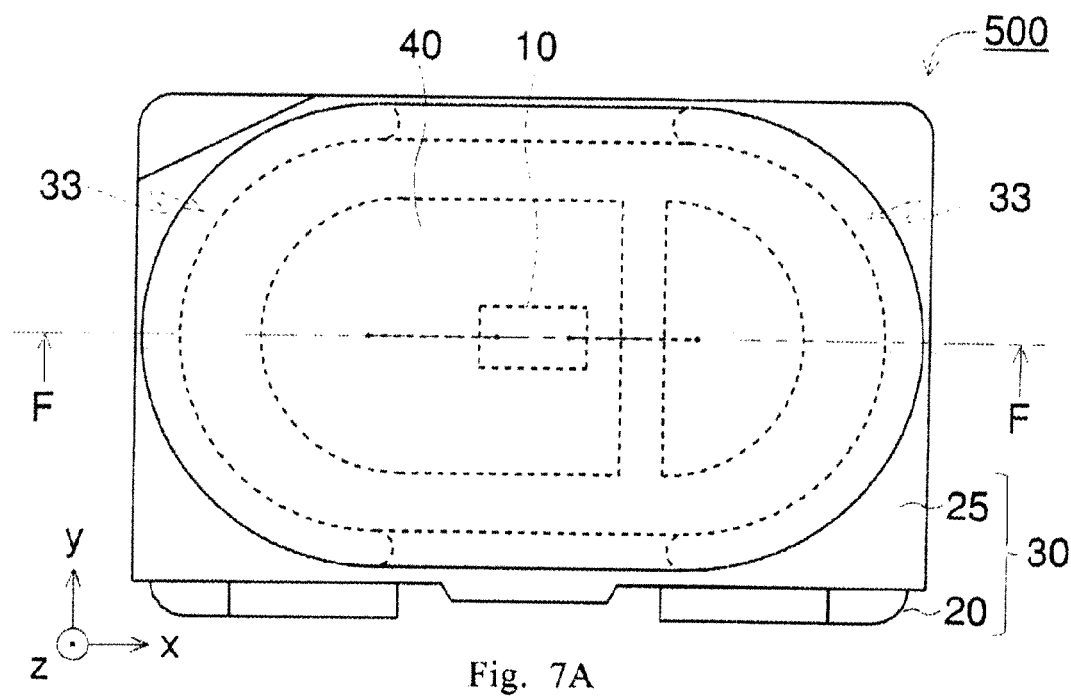
FIG. 7A is a schematic top view of a light emitting device according to an embodiment of the present invention.
Figure 7B:
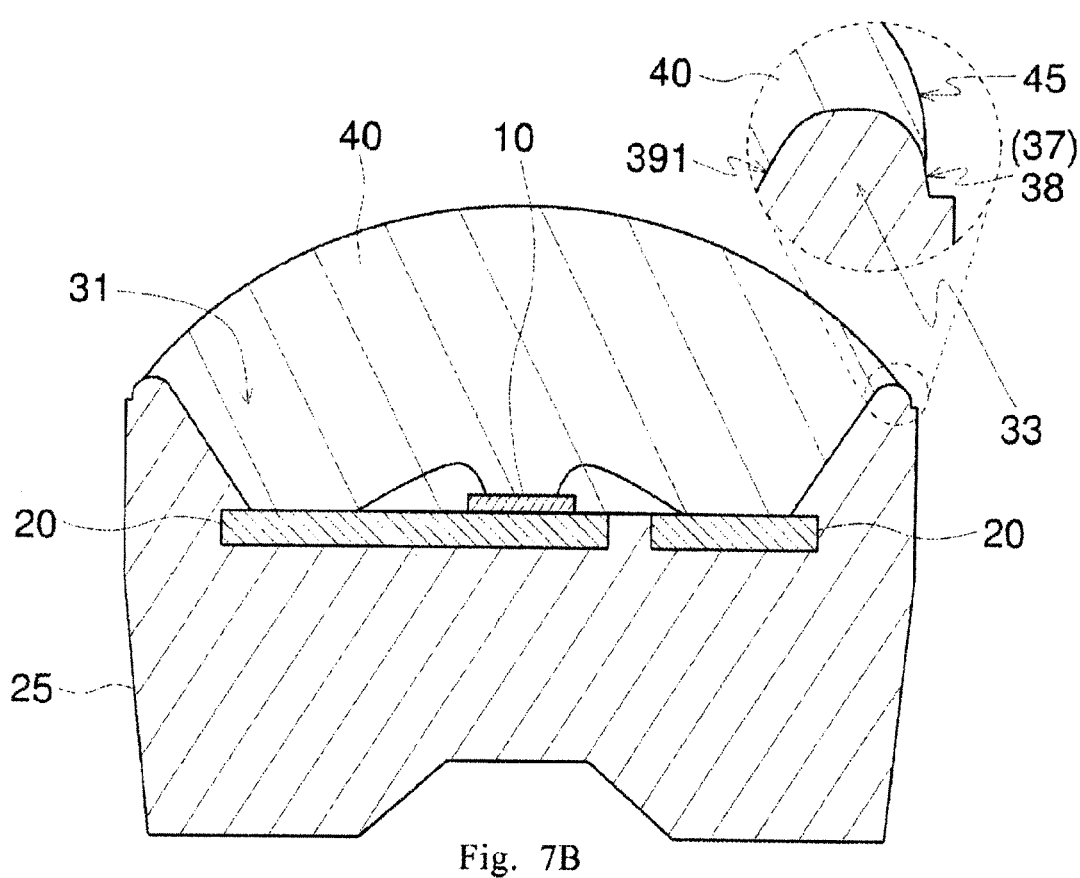
FIG. 7B is a schematic cross sectional view taken along the line F-F of FIG. 7A.

FIG. 7A is a schematic top view of a light emitting device according to a fifth embodiment, and FIG. 7B is a schematic cross sectional view taken along line F-F of FIG. 7A. The light emitting device 500 of FIG. 7 has approximately the same structure as the above-mentioned light emitting device of the fourth embodiment, except for the shapes of the recess 31 and the protrusions 33. In the above-mentioned light emitting device of the fourth embodiment, the recess 31 has a rectangular shape in a top view, which is advantageous for forming the large opening of the recess 31. In contrast, in the light emitting device 500 of FIG. 7, the recess 31 has a shape of a rectangle with semicircles on the both sides (left and right sides) (i.e. oval shape) in a top view. The protrusions 33 are provided around the recess 31 of the base body 30, and have a curved strip shape along the periphery of the semicircle parts. Thus, even when a protrusion or a groove is a strip, it is preferred that the protrusion or the groove is rounded at the corners or at the entire part in a top view of the base body 30. This suppress occurrence of distortion of the surface of the sealing member 40, and thereby allows for the comparatively smooth convex surface of the sealing member 40, which makes it easier to improve the light extraction efficiency.

Sixth Embodiment

Figure 8A:
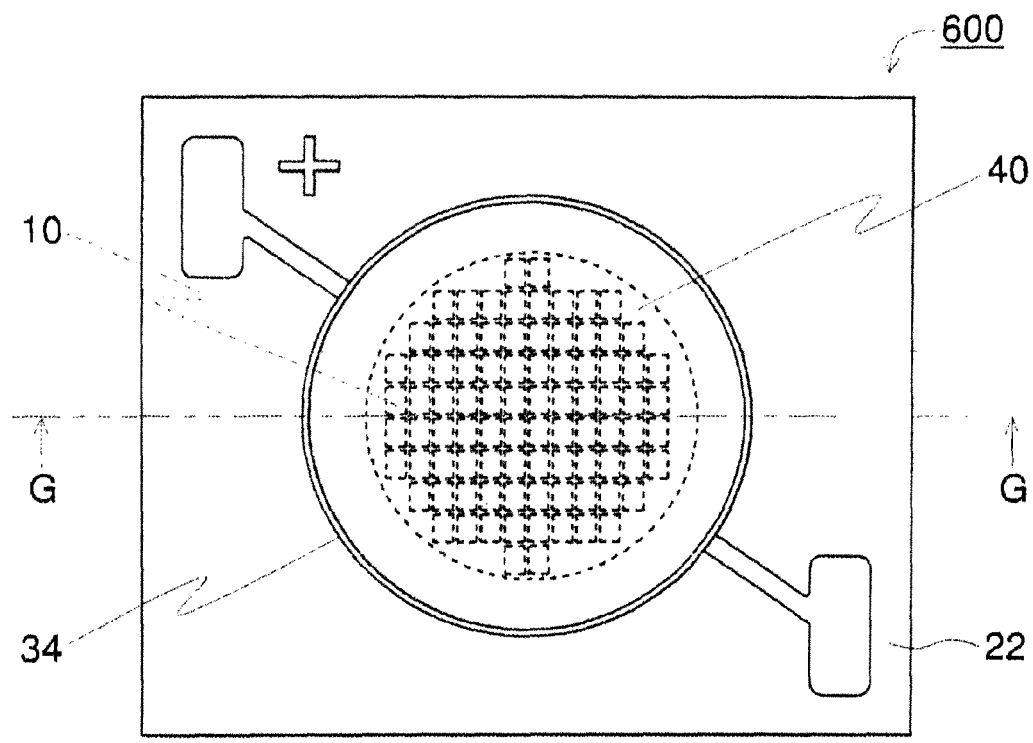
FIG. 8A is a schematic top view of a light emitting device according to an embodiment of the present invention.
Figure 8B:
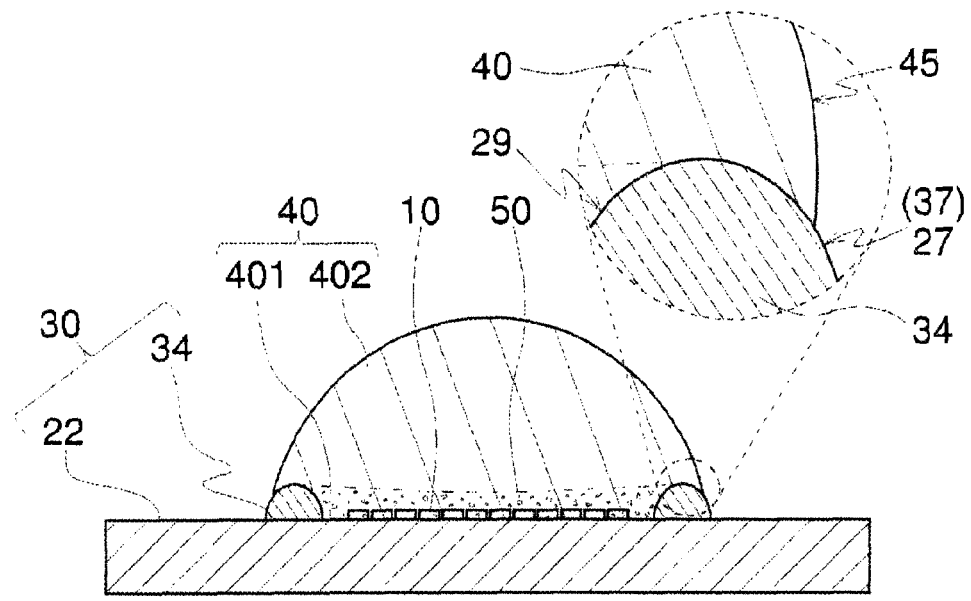
FIG. 8B is a schematic cross sectional view taken along the line G-G of FIG. 8A.

FIG. 8A is a schematic top view of a light emitting device according to a sixth embodiment, and FIG. 8B is a schematic cross sectional view taken along line G-G of FIG. 8A. The light emitting device 600 of FIG. 8 includes light emitting elements 10, a base body 30 including a wiring substrate 22 where the light emitting elements 10 is mounted and a protrusion 34 provided on the upper surface of the wiring substrate 22, and a sealing member 40 for sealing the light emitting element 10.

In more detail, the base body 30 includes the wiring substrate 22 that includes lead electrodes on the upper surface and the protrusion 34 that is a molding of white resin formed in a frame shape on the upper surface of the wiring substrate 22. The light emitting elements 10 are a plurality of LED chips that are pasted at the inner side of the protrusion 34 on the upper surface of the wiring substrate 22 by an adhesive (not shown), and are connected to the lead electrodes by wires. The sealing member 40 is a sealing resin that is provided on the base body 30 to cover the light emitting elements 10. Particularly in the embodiment, the sealing member 40 is composed of two portions, and contains a phosphor only in the lower layer, i.e. a first sealing portion 401. The phosphor 50 is excited by the light emitted from the light emitting elements 10. The first sealing portion 401 covers all of the light emitting elements 10, and fills up to approximately the top of the protrusion 34. This makes the first sealing portion 401 serve as a surface light source. The first sealing portion 401 may contain a diffuser.

As illustrated in FIG. 8B, the surface of the sealing member 40, more specifically the surface of a second sealing portion 402 of the upper layer, bulges upward from the base body 30 to be a convex. In the embodiment, at least a part of, preferably all of its sealer rising surface 37 is composed of an outward surface 27 of the protrusion 34 that faces outward in a top view.

FIGS. 9A through 9E are schematic cross sectional views illustrating an exemplary manufacturing method of the light emitting device of the sixth embodiment. The light emitting device 600 of FIG. 8 is manufactured through the following steps. It is understood that the manufacturing method of the light emitting device of the present invention may be any method as long as it involves at least a first step of providing the protrusion on the upper surface of the wiring substrate where the light emitting elements are mounted so as to form the base body and a second step of forming the sealing member for sealing the light emitting elements, and the following manufacturing method is merely an example thereof.

Figure 9A:
FIGS. 9A-9E illustrate a method for manufacturing a light emitting device according to an embodiment of the present invention, FIG. 9A showing light emitting elements mounted on a wiring substrate, FIG. 9B showing a protrusion provided on an upper surface of the wiring substrate, FIG. 9C showing a sealing member in a fluidized condition being dropped on the base body, FIG. 9D showing the sealing member being cured by heating, cooling or the like, and FIG. 9E showing the wiring substrate cut into individual light emitting elements.

First, as illustrated in FIG. 9A, the light emitting elements 10 are mounted on the wiring substrate 22. Specifically, the light emitting elements 10 are pasted on the wiring substrate 22 by an adhesive, and are connected to the lead electrodes of the wiring substrate 22 by wires. In this method, a composite board is employed for the wiring substrate 22, from which a plurality of light emitting devices can be produced.

Figure 9B:
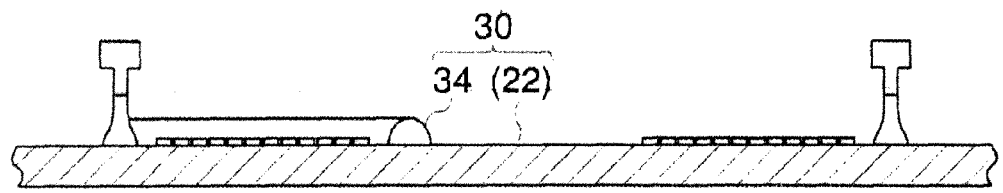

Then, as illustrated in FIG. 9B, the protrusion 34 is provided on the upper surface of the wiring substrate 22 so as to form the base body 30. Specifically, the fluid material which is in fluidized condition (liquid, sol or slurry) of the protrusion 34 is dropped on the upper surface of the wiring substrate 22 to draw a frame surrounding the light emitting elements 10, and then the fluid material is cured by heating, cooling or the like. The mounting step of the light emitting elements and the forming step of the protrusion may be carried out in the reverse order.

Figure 9C:
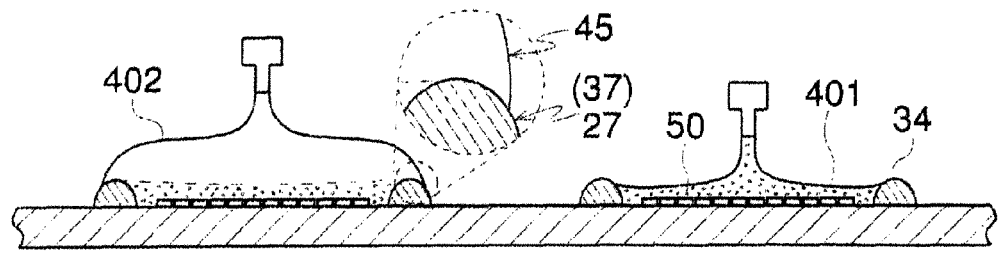
Figure 9D:
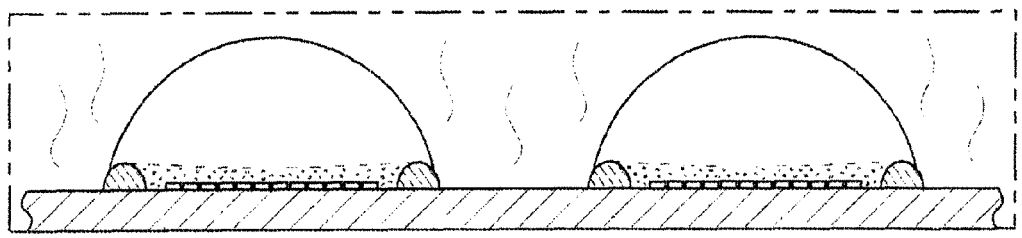

Then, as illustrated in FIGS. 9C and 9D, the sealing member 40 is formed on the base body 30. In the present invention, the sealing member is particularly formed by dropping (potting). A dropping method is a low-cost molding method that does not require a molding machine or a metal mold compared to compression molding, transfer molding, injection molding and cast molding. Further, a dropping method can prevent deformation of the wires since the material of the sealing member does not flow much during formation of the sealing member. Specifically, the fluid sealing member 40 which is in fluidized condition (liquid, sol or slurry) is dropped on the base body 30 to cover the light emitting elements 10 using a dispenser or the like, and then the sealing member 40 is directly cured by heating, cooling or the like. In this step, the sealing member 40 is formed such that the outward surface 27 of the protrusion 34 serves as at least a part of its sealer rising surface 37. In other words, the sealing member 40 is formed such that at least a part of its surface 45 rises from the outward surface 27 of the protrusion 34.

As mentioned above, the tangent line of the surface 45 of the sealing member 40 (at the contact point between the outward surface 27 and the periphery of the sealing member 40) makes an angle of approximately the contact angle with the outward surface 27.

In the embodiment, the material of the first sealing portion 401 containing the phosphor 50 is dropped on the inside of the protrusion 34, and then the material of the second sealing portion 402 is dropped thereon. The second sealing portion 402 may be formed after the first sealing portion 401 is completely cured. However, forming the second sealing portion 402 on the uncured or half-cured first sealing portion 401 can enhance the adhesion between the first sealing portion 401 and the second sealing portion 402.

While the sealing member 40 is being cured, the base body 30 may be flipped over, i.e. the upper surface of the base body 30 where the sealing member 40 is dropped may face vertically downward. By doing so, the fluid sealing resin 40 can hang down by gravity while the sealing resin 40 is being cured. As a result, the surface of the sealing member 40 can bulge higher by the action of gravity. In this case, the angle between the tangent line of the surface 45 of the sealing member and the outward surface 38 can be less than the contact angle since the sealing resin 40 hangs down by gravity.

Figure 9E:
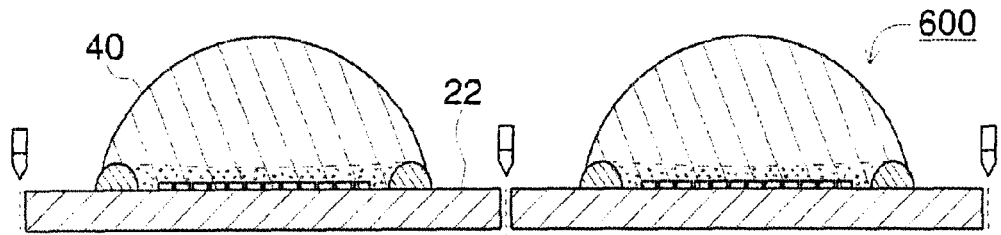

Lastly, as illustrated in FIG. 9E, the wiring substrate 22 (composite board) is cut into the individual light emitting elements 600. Alternatively, the base body 30 may be divided into individual pieces before forming the sealing member 40, or the wiring substrate 22 may be originally separated as a single light emitting device.

In the present invention, providing the sealing member on the base body as mentioned above allows for comparatively stable formation of the high convex surface of the sealing member, which results in sufficiently improved light extraction efficiency.

Given the droplet L is made of the fluid sealing member 402 before curing and the solid S is made of the base body 30, the contact angle $\theta$ of the sealing member 402 is determined by the surface tension of the sealing member 402, the surface tension of the base body 30 (specifically, the protrusion 34) on which the periphery of the sealing member 402 is positioned and the interfacial tension between the sealing member 402 and the base body 30 (protrusion 34). In this case, by placing the periphery of the sealing member 402 on the outward surface 27 of the protrusion 34, the angle of the tangent line of the surface 45 of the sealing member (at the contact point between the outward surface 27 and the periphery of the sealing member) relative to the horizontal plane can be increased over the contact angle $\theta$, although the angle of the tangent line of surface 45 of the sealing member relative to the outward surface 27 remains approximately the contact angle θ. That is, since the sealing member 40 is formed such that the outward surface 27 of the protrusion 34 serves as at least a part of the sealer rising surface 37, the surface 45 of the sealing member easily rises from the outward surface 27 in the vertical direction. This facilitates forming the surface of the sealing member 40 in a high convex shape, preferably a convex curved shape, more preferably an approximate spherical shape. Furthermore, such surface shapes can be duplicated stably. As a result, light emitting devices having high light extraction efficiency can be manufactured at low cost.

Further, in order to form the high convex surface of the sealing member, a low-surface tension coating may be provided on the entire upper surface of the base body before dropping the sealing member. However, since the coating is present at the entire interface between the base body and the sealing member in this case, it may largely degrade the adhesion between the base body and the sealing member. In contrast, in the embodiment, since the sealing member is basically in direct contact with the surface of the base body, it produces strong adhesion between the base body and the sealing member, which offers high reliability of the light emitting device. In particular, since the surface of the sealing member rises from the outward surface of the base body, the outward surface act to lock the periphery of the sealing member on the protrusion, which further enhance the adhesion between the base body and the sealing member.

Preferred embodiments of the protrusion 34 and the sealing member 40 will be described in detail below.

In the light emitting element 600 of FIG. 8, the outward surface 27 of the protrusion 34 has a convex curved shape. Now, consider a situation when the fluid sealing member dropped on the base body is reaching the edge between the outward surface of the protrusion and a surface continuing from the upper side of the outward surface. If the outward surface of the protrusion is a flat surface that inflects against the surface continuing from the upper side of the outward surface, the sealing member is once accumulated on the surface continuing from the upper side of the outward surface by the action of the above-mentioned "pinning effect of wetting". Then, when the sealing member crosses over the edge, it radically flows due to its own weight and may break its surface shape. In contrast, if the outward surface of the protrusion includes a convex curved surface at the top part, it suppresses the "pinning effect of wetting" as mentioned above and leads the sealing member smoothly to the outward surface. This facilitates stably forming the high convex surface of the sealing member 40. In this case, at least a part of the sealer rising surface 37 may be either a convex curved surface, or a surface continuing from the lower side of the convex curved surface of the outward surface 27. Thus, it is preferred that the outward surface 27 is a convex curved surface, or a lower-side surface continuing from the convex curved surface. If the protrusion 34 is formed using a metal mold, the convex curved surface at the top part of the outward surface 27 of the protrusion 34 can prevent the protrusion 34 from biting to a metal mold to cause chipping, which results in improved moldability of the protrusion 34.

In the light emitting element 600 of FIG. 8, the inward surface 29 of the protrusion 34 that faces inward in a top view has a convex curved shape. Now, consider a situation when the fluid sealing member dropped on the base body is reaching the edge between the inward surface of the protrusion and a surface continuing from the upper side of the inward surface. If the inward surface of the protrusion is a flat surface that inflects against the surface continuing from the upper side of the inward surface, the sealing member is once accumulated on the inward surface by the action of the above-mentioned "pinning effect of wetting". Then, when the sealing member crosses over the edge, it may radically flow due to its own weight to run over the outward surface. However, since the inward surface 29 of the protrusion 34 includes a convex curved surface at the top part, it suppresses the "pinning effect of wetting" as mentioned above and leads the sealing member 40 smoothly to the surface continuing from its upper side and further to the outward surface 27. This facilitates stably forming the high convex surface of the sealing member 40. Thus, in the structural surface of the base body 30, it is preferred a convex curved surface is provided at the top part of all of or at least a part of the inward surface 29 that is located at the inner side of the sealer rising surface 37 and faces inward in a top view of the base body.

In the light emitting device 600 of FIG. 8, the protrusion 34 is formed in a ring shape surrounding the light emitting elements 10 in a top view. The protrusion 34 serves to provide the outward surface 27 from which the surface 45 of the sealing member rises, as well as serves as a barrier to hold back the fluid sealing member 40. For this reason, it is preferred that the protrusion is formed in a frame shape surrounding the light emitting elements. The frame shape of the protrusion 34 facilitates holding back the sealing member 40 and increases the proportion of the outward surface 27 of the protrusion 34 in the sealer rising surface 37, which makes it easier to form the high convex surface of the sealing member 40. Further, the surface 45 of the sealing member tends to be formed so as to bridge between the protrusions, which results in improved symmetry of the surface shape of the sealing member 40. In particular, it is preferred that the protrusion 34 is formed in a loop shape in a top view of the base body 30, more preferably an oval shape, yet more preferably an exact circular shape. This allows for less distortion of the convex surface of the sealing member 40, which makes it easier to improve the light extraction efficiency and allows for highly symmetrical light distribution. Further, it is preferred that the protrusion 34 is approximately centered on the light emitting elements 10, because this improves the symmetry of the light distribution.

Seventh Embodiment

Figure 10A:
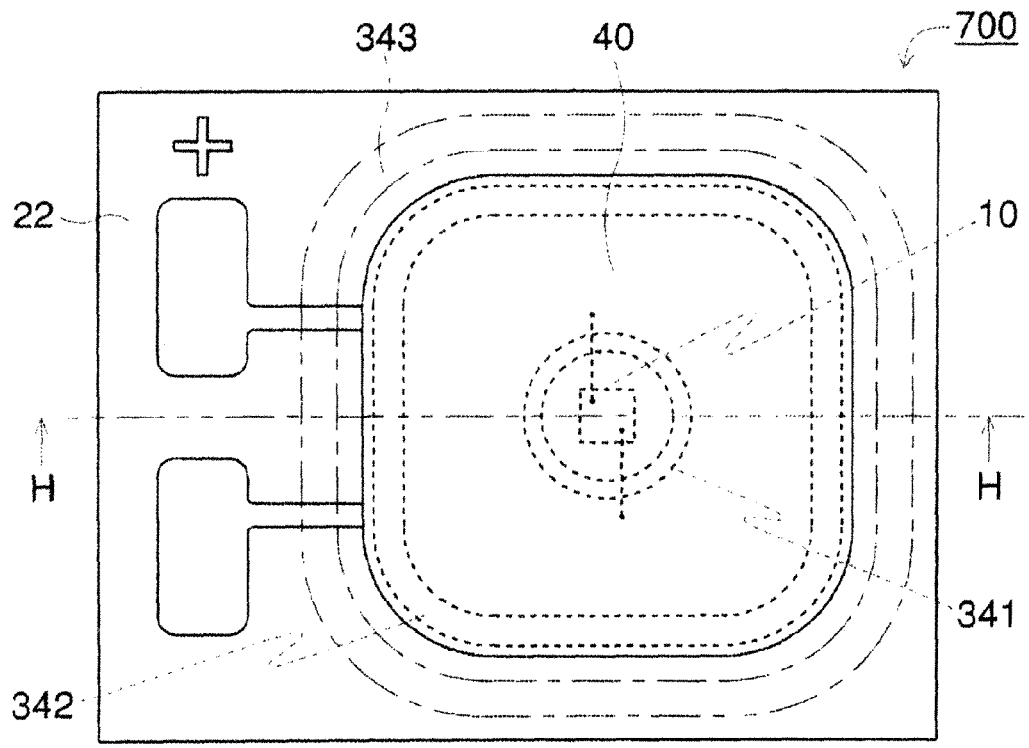
FIG. 10A is a schematic top view of a light emitting device according to an embodiment of the present invention.
Figure 10B:
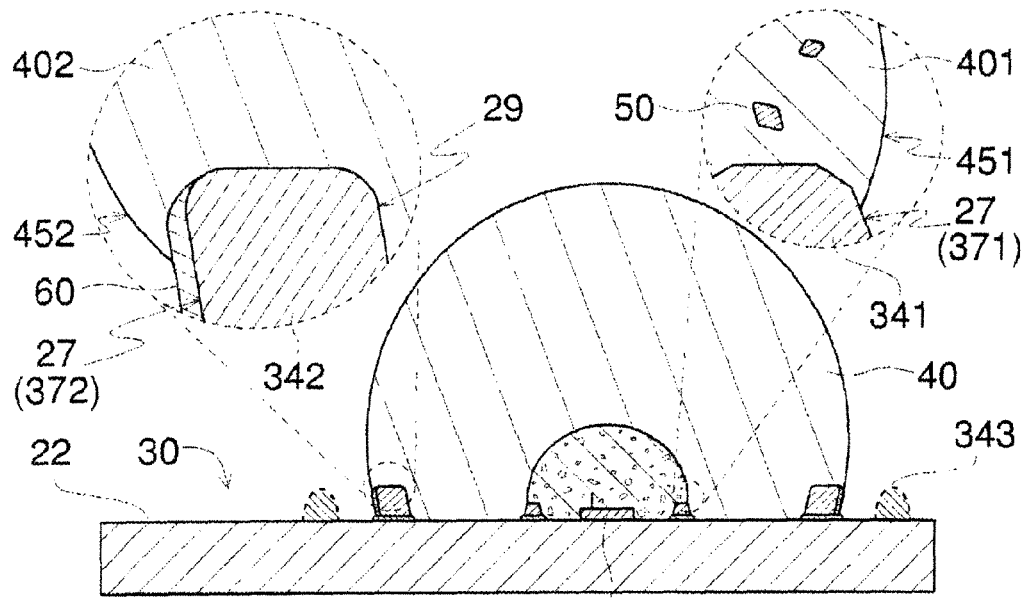
FIG. 10B is a schematic cross sectional view taken along the line H-H of FIG. 10A.

FIG. 10A is a schematic top view of a light emitting device according to a seventh embodiment, and FIG. 10B is a schematic cross sectional view taken along line H-H of FIG. 10A. The light emitting device 700 of FIG. 10 includes a light emitting element 10, a base body 30 including a wiring substrate 22 where the light emitting device 10 is mounted and a protrusion 34 provided on the upper surface of the wiring substrate 22, and a sealing member 40 for sealing the light emitting element 10.

In more detail, the base body 30 includes the wiring substrate 22 including lead electrodes on the upper surface, and further includes a first protrusion 341 and a second protrusion 342 on the outer side of the first protrusion 341 both of which are provided on the upper surface of the wiring substrate 22. The first and second protrusions 341 and 342 are moldings of white resin that are previously molded in a predetermined shape, and are pasted on the upper surface of the wiring substrate 22 by an adhesive. The light emitting element 10 is a single LED chip that is pasted at the inner side of the protrusion 34 on the upper surface of the wiring substrate 22 by an adhesive (not shown) and is connected to the wiring substrate by wires. The sealing member 40 is a sealing resin that is provided on the base body 30 to cover the light emitting element 10.

In the light emitting device 700 of FIG. 10, at least a part of the surface of the sealing member 40, i.e. at least a part of the surface 452 of a second sealing portion 402, rises from an outward surface 27 of the second protrusion 342. Thus, it is preferred that the first protrusion and the outer second protrusion are provided on the wiring substrate in the first step, and then the outward surface of either first or second protrusion serves as at least a part of the sealer rising surface in the second step. A plurality of protrusions 341 and 342 on the wiring substrate 22 provide a plurality of outward surfaces 27 at the inner side of the end face of the outmost of the wiring substrate 22. Then, the at least a part of surface 45 of the sealing member can rises from the outward surface 27 of either protrusion 341 or 342. This offers options of the outward surfaces 27 for the sealer rising surface when the sealing member 40 is formed on the base body 30 by dropping, and the size of the sealing member 40 can be adjusted while the surface of the sealing member 40 is formed in a high convex. Further, the first protrusion 341 may be positioned at the outer side of wire connection parts of lead electrodes of the wiring substrate 22 to which wires are connected. This prevents distortion of the surface shape of the sealing member 40 due to the wires. On the contrary, the first protrusion 341 may be positioned at the inner side of the wire connection parts of the lead electrodes of the wiring substrate 22 to which the wires are connected. This prevents the wire connection parts of the wiring substrate 22 from being contaminated by the leaked adhesive for the light emitting element 10, and thereby prevents poor connection of the wires.

In the light emitting device 700 of FIG. 10, the sealing member 40 includes a first sealing portion 401 for sealing the light emitting element 10 and the second sealing portion 402 for sealing the first sealing portion 401. The first sealing portion 401 is formed such that in the structural surface of the base body 30, the outward surface 27 of the first protrusion 341 serves as at least a part of a first sealer rising surface 371 from which the surface 451 of the first sealing portion rises. The second sealing portion 402 is formed such that among the structural surface of the base body 30, the outward surface 27 of the second protrusion 342 serves as at least a part of a second sealer rising surface 372 from which the surface 452 of the second sealing portion rises. This structure allows for comparatively stable formation of the surface of each sealing portion (layer), although the sealing member 40 is formed through a plurality of separate steps. As a result, light reflection on the interface between the two sealing portions can be suppressed, which makes it easier to improve the light extraction efficiency. The sealing portions may be made of the same material and thereby have the same refractive index. However, if the refractive indexes of the sealing portions comes close to the refractive index of the air in a stepwise fashion, such structure can not only efficiently extract the light from the light emitting element 10 into the sealing member 40 and but also suppress light reflection on the interface of the two sealing portions, which results in further improved light extraction efficiency. Thus, it is preferred that the second sealing portion 402 has lower refractive index than the first sealing portion 401. The second sealing portion 402 may be formed after the first sealing portion 401 is completely cured. However, forming the second sealing portion 402 on the uncured or half-cured first sealing portion 401 can enhance the adhesion between the first sealing portion 401 and the second sealing portion 402. Alternatively, since the first sealing portion 401 is an inner region of the sealing member 40, it may be formed by use of the above-mentioned "pinning effect of wetting". In this case, the surface 451 of the first sealing portion 401 rises from an end edge of the upper surface, which is the boundary to the outward surface 27 of the first protrusion 341.

In the light emitting device 700 of FIG. 10, the sealing member 40 contains a phosphor 50 only in the first sealing portion 401. The phosphor 50 is excited by the light emitted from the light emitting element 10. Because the wavelength conversion and diffusion by the phosphor 50 occur only inside the first sealing portion 401, i.e. in the vicinity of the light emitting element 10 in the sealing member 40, this structure allows for smaller size of the light source with respect to the surface of the sealing member comparing to the case where the phosphor is dispersed approximately over the sealing member 40, which results in improved light extraction efficiency. Furthermore, since the surface of the first sealing portion 401 can be formed in a high convex in this embodiment, light path length in the first sealing portion 401 has small variation among different directions, which allows for approximately uniform chromaticity of the light emission although the phosphor 50 is dispersed in the first sealing portion 401. In the first sealing portion 401, the phosphor 50 may be deposited or a dispersant may be contained.

In the light emitting device 700 of FIG. 10, the outward surface 27 of the first protrusion 341 includes a flat surface at the top part. While it is the most preferred that the outward surface 27 of the protrusion includes a convex curved surface at the top part in order to suppress the "pinning effect of wetting" as mentioned above, the top part may also be a flat surface that makes a descending slope (inclination angle) of preferably 45 degrees or less, more preferably 30 degrees or less with another flat surface continuing from the upper side of the outward surface. This makes a comparatively blunt edge between the adjacent two flat surfaces, and thereby suppresses accumulation of the sealing member 40 by the action of the "pinning effect of wetting". As a result, the sealing member 40 is comparatively smoothly flown to the outward surface 27 of the protrusion. As used herein, "the flat surface continuing from the upper side of the outward surface" may be either approximately horizontal upper surface or outward surface of the protrusion. That is, the outward surface 27 of the protrusion may be composed of a plurality of flat surfaces each of which makes descending slope of preferably 45 degrees or less, more preferably 30 degrees or less with the surface continuing from the upper side thereof.

In the light emitting device 700 of FIG. 10, the outward surface 27 of the second protrusion 342 makes an acute angle with the upper surface of the wiring substrate 22 (the angle at the outside of the protrusion). In the other word, the outward surface 27 of the second protrusion 342 is inclined so as to face with the upper surface of the wiring substrate 22. As mentioned above, the broader the inclination angle ($\alpha$) of the outward surface 27 relative to the approximately horizontal upper surface of the base body 30 is, the more easily the surface of the sealing member 40 is formed in high convex. Further, the shape and material of the protrusion on the wiring substrate can be selected from wide choices, because it can be previously formed as an independent component separated from the wiring substrate. Furthermore, the edge thereof can be processed with high precision. This facilitates forming the protrusion having an acute angle between the outward surface of the protrusion and the upper surface of the wiring substrate, which makes it easier to form the high convex surface of the sealing member 40. The outward surface of the protrusion that serves as the sealer rising surface makes an angle of preferably 30 to 135 degrees, more preferably 45 to 90 degrees with the upper surface of the wiring substrate (the angle at the outside of the protrusion). With such an angle, the surface of the sealing member can be easily formed in a high convex, which makes it easier to improve the light extraction efficiency.

In the light emitting device 700 of FIG. 10, the second protrusion 342 has a rounded square frame shape in a top view. In the top view, it is preferred that the protrusion is rounded at least at the corners or at the entire part such as a ring shape as illustrated in the sixth embodiment. If the protrusion has sharp corners in a top view of the base body, they cause distortion of the surface of the sealing member around the corners. However, by rounding at least the corners of the protrusion, the surface of the sealing member can be formed in a comparatively smooth convex while occurrence of such distortion is suppressed, which makes it easier to improve the light extraction efficiency.

In the light emitting device 700 of FIG. 10, a coating 60 having a critical surface tension of 50 mN/m or less is formed on the outward surface 27 of the second protrusion 342 that serves as the sealer rising surface 372. When the fluid sealing member 402 is shaped as illustrated in FIG. 9C, the smaller the surface tension of the outward surface 27 (solid S of FIG. 3) of the protrusion 34 is, the broader the contact angle of the sealing member 402 (the contact angle θ of the droplet L of FIG. 3) is. To take advantage of this, the coating having a smaller surface tension, specifically having a critical surface tension of 50 mN/m or less, is formed only on the outward surface of the base body that serves as the sealer rising surface or on the outward surface of the base body that serves as the sealer rising surface as well as the structural surface of the base body at the outer side of the outward surface before the sealing member is formed on the base body by dropping. With this structure, the surface of the sealing member can rise from the outward surface more easily. As a result, this facilitates forming the high convex surface of the sealing member 40, which makes it easier to improve the light extraction efficiency. Further, by limiting the area of the coating 60 as mentioned above, the sealing member 40 is in direct contact with the surface of the base body 30 at the inner side of the outward surface 27, which produces high adhesion between the base body 30 and the sealing member 40. Exemplary materials of the coating 60 include silicone oil, paraffin hydrocarbons, higher alcohols, higher fatty acids, silicone resins, fluororesins, polyolefin resins, polynorbornene reins and the like. Among them, silicone oil is preferred since it is absorbed into the sealing member during the curing process of the sealing member and causes less degradation of the adhesion with the base body.

The number of the protrusions is not particularly limited. Further, another protrusion may be left at the outer side of the sealer ring surface after the sealing member is formed on the base body. For example, as illustrated by the dash-dot line in FIG. 10, a third protrusion 343 may be further provided at the outer side of the second protrusion 342 on the wiring substrate 22. In this case, the inward surface of the third protrusion 343 is opposed to the outward surface 27 of the second protrusion 342 that serves as the sealer rising surface 372. With this structure, the inward surface of the third protrusion 343 can reflect the light emitted from the periphery of the sealing member on the outward surface 27 of the second protrusion 342 toward the front surface of the device, which allows for effective extraction of the light. It is particularly preferred that the inward surface, which is opposed to the outward surface that serves as the sealer rising surface, is inclined or curved such that it spreads upward. This shape can effectively reflect the light emitted from the periphery of the sealing member positioned on the outward surface of the protrusion toward the front surface of the device. Further, it is preferred that the inward surface, which is opposed to the outward surface that serves as the sealer rising surface, has approximately the same height as, more preferably higher than the opposed outward surface. This shape can easily reflect the light emitting from the periphery of the sealing member on the outward surface of the base body toward the front surface of the device.

In the light emitting device 700 of FIG. 10, one sealing portion (the first sealing portion 401) is embedded inside another sealing portion (the second sealing portion 402). However, the present invention is not limited thereto, and if there are a plurality of sets of a protrusion and a sealing portion whose surface rises at least partially from the outward surface of the corresponding protrusion, a plurality of sealing portions may be embedded inside one sealing portion. For example, a plurality of inner sealing portions may respectively seal red, green and blue light emitting elements.

Eighth Embodiment

FIG. 11A is a schematic top view of a light emitting device according to an eighth embodiment, and FIG. 11B is a schematic cross sectional view along the J-J line of FIG. 11A. The light emitting device 800 of FIG. 11 includes a light emitting element 10, a base body 30 including a wiring substrate 22 where the light emitting element 10 is mounted and protrusions 34 provided on the upper surface of the wiring substrate 22, and a sealing member 40 for sealing the light emitting element 10. In more detail, the base body 30 includes the wiring substrate 22 that is provided with lead electrodes on the upper surface and the protrusions 34 that are moldings of white resin and are placed on both lateral sides of the light emitting element 10 on the upper surface of the wiring substrate 22 extending linearly in the height direction (y-direction in the figure). The light emitting element 10 is a single LED chip that is located at the inner side of the protrusions 34 on the upper surface of the wiring substrate 22, and is pasted on the lead electrodes by a conductive adhesive. Further, a coating member (first coating member) 70 is provided under the light emitting element 10, i.e. between the light emitting element 10 and the wiring substrate 22. The coating member 70 is made of white resin. This coating member can reflect the light emitted downward from the light emitting element 10 to efficiently extract it upward.

As illustrated by the dashed line in FIG. 11B, the light emitting device 800 of the embodiment may include a wavelength converter 55 that is placed on the light emitting element 10 and contains a phosphor to be excited by the light emitted from the light emitting element 10. For example, the wavelength converter 55 is a plate that is pasted on the upper surface of the light emitting element 10.

Further, as illustrated by the dashed line in FIG. 11B, the light emitting device 800 of the embodiment may include a coating member (second coating member) 75 that covers the upper surface of the wiring substrate 22 around the light emitting element 10. The coating member 75 may be provided in various coating forms. The coating member 75 covers at least a part of the upper surface of the wiring substrate 22. If the coating member 75 is made of light reflecting material such as white material, it can prevent the light emitted from the light emitting element 10 from being absorbed by the wiring substrate 22, which results in improved light extraction efficiency. For this reason, it is preferred that the coating member 75 is placed at the inner side of the protrusion 34, in particular at the inner side of the protrusion 34 that serves as the sealer rising surface 37, but the coating member 75 may also be placed at the outer side of the protrusion 34. If there are a plurality of protrusions, the coating member 75 may be placed between the protrusions. Further, if the coating member 75 is made of a material having gas barrier properties higher than the sealing member 40 and covers the lead electrodes, it can prevent the lead electrodes from being discolored by corrosive gas, which facilitates maintaining the high light extraction efficiency. Alternatively, the coating member 75 may be placed covering the side surfaces of the light emitting element 10, leaving the upper surface of the light emitting element 10 exposed. Further, the coating member 75 may be placed covering the side surfaces of the light emitting element 10 and wavelength converter 55, leaving the upper surface of the wavelength converter 55 exposed. In these cases, if the coating member 75 is made of light reflecting material, it can define a light source whose main light extracting surface is the upper surface of the light emitting element 10 or the upper surface of the wavelength converter 55.

The sealing member 40 is a sealing resin that is provided on the base body 30 to cover the light emitting element 10 (the complex light source if the device includes the wavelength reflector 55). At least a part of the surface of the sealing member 40 is a convex cross-sectional shape that rises from the outward surface 27 of the lateral protrusions 34 along a plane perpendicular to the y-direction (x-z plane), and has a rectangular cross-sectional shape whose lateral sides approximately flush with the respective end faces of the wiring substrate 22 along a plane parallel to the y-direction (y-z plane). That is, the sealing member 40 is formed in an approximately semicircular column having such surface shape. As mentioned above, although the protrusions 34 extend in a strip shape, at least a part of the surface 45 of the sealing member rises from the outward surfaces 27 of the protrusions 34 so that the surface of the sealing member 40 has a high convex cross-sectional shape along a plane perpendicular to the extending direction (y-direction), which results in improved light extraction efficiency.

As mentioned above, the protrusion may be formed in a strip shape besides a frame shape. This shape allows for smaller shape of the protrusion, and the outward surface can be easily formed in a small area at the inner side of the outermost end face of the wiring substrate. In this case, the number of the protrusion may be one, but it is preferred that at least two protrusions are provided sandwiching the light emitting element. With this structure, the surface of the sealing member tends to be formed so as to bridge between the protrusions, which results in improved symmetry of the surface shape of the sealing member. Further, a plurality of protrusions may be provided separately from each other in a shape like a dashed line, or may be scattered.

FIGS. 12A to 12D are schematic views illustrating an exemplary manufacturing method of the light emitting element according to the eighth embodiment, each of which includes a top view and a cross sectional view along the dash-double-dot line. The light emitting device 800 of FIG. 11 is manufactured through the following steps.
(First Step)

Figure 12A:
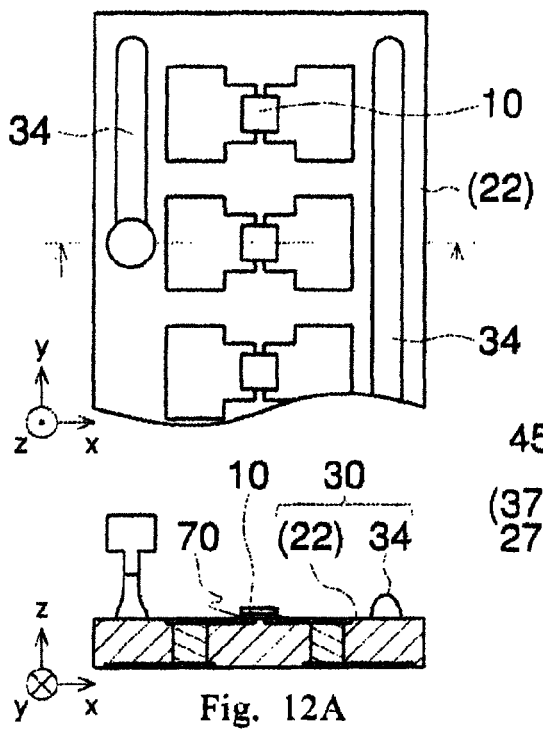
FIGS. 12A-12D illustrate a method for manufacturing a light emitting device according to an embodiment of the present invention, FIG. 12A showing light emitting elements mounted on a wiring substrate, FIG. 12B showing a fluid sealing member dropped on a base body, FIG. 12C showing the sealing member being cured by heating, cooling or the like, and FIG. 12D showing the wiring substrate and sealing member cut between light emitting elements so as to separate individual light emitting devices.

First, as illustrated in FIG. 12A, the light emitting elements 10 are mounted on the wiring substrate 22. Specifically, the light emitting elements 10 are pasted on the lead electrodes of the wiring substrate by a conductive adhesive. In this case, it is preferred that a plurality of the light emitting elements 10 are aligned in one direction (the y-direction in the figure), but the number of the light emitting elements 10 may be one. The number of row may be one or plural. In the method, a composite wiring substrate is employed for the wiring substrate 22, from which a plurality of light emitting devices can be produced.

Next, the protrusions 34 are formed on the upper surface of the wiring substrate 22 so as to form the base body 30. Specifically, a fluid material of the protrusions 34 is dropped on the upper surface of the wiring substrate 22 to draw a predetermined shape, and then the material is solidified. In this step, the protrusions 34 are formed in a strip shape extending approximately parallel to the alignment of the light emitting elements 10 (the y-direction in the figure). The protrusions 34 are formed on the both sides of the light emitting elements 10. As used herein, the term "strip shape" includes a partially strip shape such as frame shape. The mounting step of the light emitting elements and the forming step of the protrusion may be carried out in a reverse order.
(Second Step)

Figure 12B:
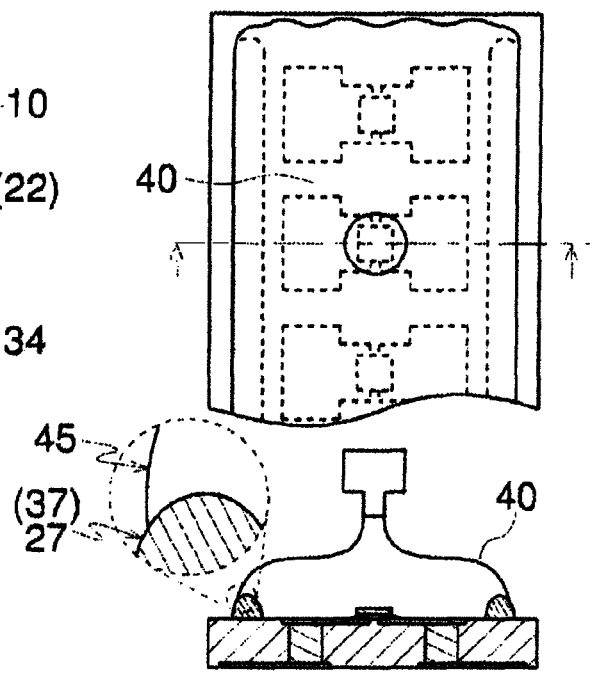
Figure 12C:
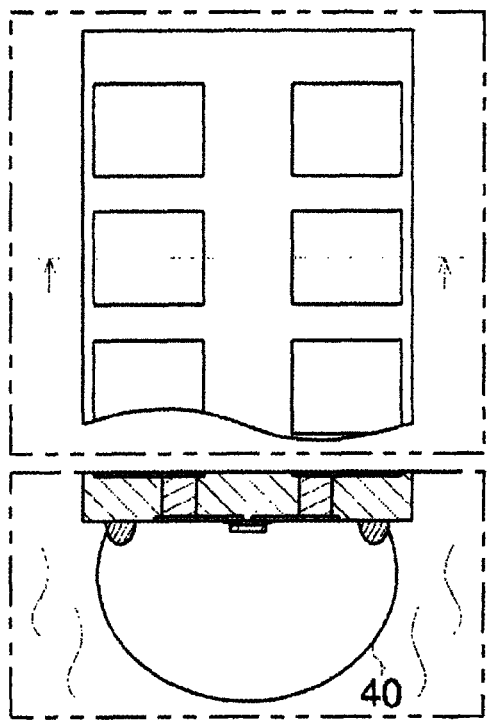

Next, as illustrated in FIGS. 12B and 12C, the sealing member 40 is formed on the base body 30 by dropping. Specifically, the fluid sealing member 40 is dropped on the base body 30 using a dispenser or the like to cover the light emitting elements 10, and then the sealing member 40 is cured by heating, cooling or the like. In this step, the sealing member 40 is formed such that the outward surface 27 of the protrusion 34 serves as at least a part of its sealer rising surface 37. In other words, the sealing member 40 is formed such that at least a part of its surface 45 rises from the outward surface 27 of the protrusion 34. Further, it is preferred that the sealing member 40 is formed so as to bridge between the protrusions 34 on the both sides in order to improve the symmetry of its surface shape. While the sealing member 40 is being cured, the base body 30 may be flipped over as illustrated in the figure, i.e. the upper surface of the wiring substrate 22 where the sealing member 40 is dropped may face vertically downward. By doing so, the surface of the sealing member 40 can bulge higher by the action of gravity. In particular, the surface of the sealing member 40 can be formed extending long in the vertical direction, which allows for satisfactory light distribution and high light intensity of the light emitting device. In order to form the high convex surface of the sealing member, this curing step in such position is particularly suitable for an inclined protrusion whose outward surface is opposed to the upper surface of the wiring substrate, such as the second protrusion 342 of the seventh embodiment, because the protrusion can hold comparatively a large amount of sealing member. It is understood that the sealing member 40 may be cured in normal position, i.e. with the upper surface of the wiring substrate 22 facing vertically upward.
(Third Step)

Figure 12D:
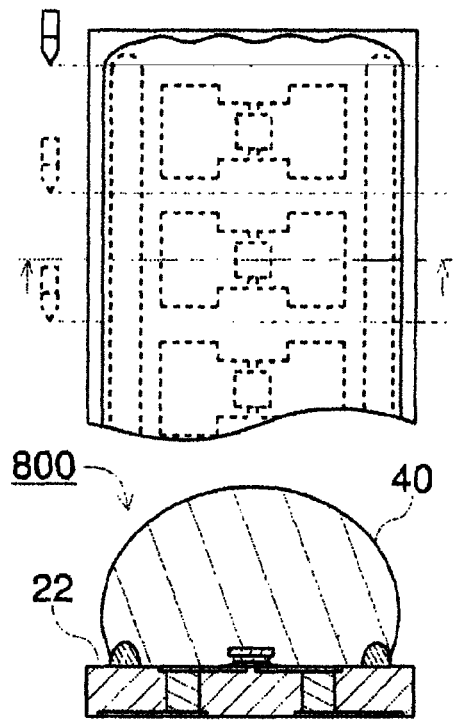

Lastly, as illustrated in FIG. 12D, the wiring substrate 22 and the sealing member 40 are cut between the light emitting elements so as to separate the individual light emitting devices 800. In this step, it is preferred that the wiring substrate 22 and the sealing member 40 are cut in the direction approximately perpendicular to the alignment of the light emitting elements 10. Through the above-mentioned steps, the light emitting devices 800 of FIG. 11 can be manufactured with high productivity.

The wiring substrate 22 and the sealing member 40 may be cut at any position. In this method, they are cut so that one light emitting device includes one light emitting element, but they are cut so that one light emitting device includes a plurality of light emitting elements. Further, when the side protrusions 34 are open as illustrated in the figure, since the sealing member 40 tends to have distortion at the end parts in the direction approximately parallel to the extending direction of the protrusions 34, such end parts may be removed. Alternatively, the wiring substrate 22 and the sealing member 40 may not be cut so as to manufacture a comparatively large light emitting device.

Besides the linear shape, the strip protrusions 34 may be formed in a curved shape such as curved line shape and wavy shape. In this case, it is preferred that the light emitting elements 10 are located adjacent to the outward bulges of the wavy shape. With this arrangement, the surface of the sealing member 40 can partially have a convex cross-sectional shape also along a plane approximately parallel to the alignment of the light emitting elements 10, which makes easier to improve the light extraction efficiency. It is more preferred that the protrusions 34 are placed approximately symmetrically across the light emitting elements 10.

Hereinafter, each component of the light emitting devices of the present invention will be described.

(Light Emitting Element 10)

The light emitting element may be a semiconductor light emitting element such as LED and LD. The light emitting element may be any element as long as it is made of a semiconductor element structure of any type with a pair of positive and negative electrodes. It is particularly preferred that the light emitting element is made of a nitride semiconductor ($In_xAl_yGa_{1-x-y}N$, $0 \leq x$, $0 \leq y$, $x+y \leq 1$) that can effectively excite a phosphor. Besides, the light emitting element may be made of a gallium-arsenic or gallium-phosphorus semiconductor that emits green to red light. If the pair of positive and negative electrodes are provided on the same side, the light emitting element may be mounted face-up in which the electrodes are connected to the conductive member or the lead electrodes of the wiring substrate by wires, or it may be mounted face-down (flip-chipped) in which the electrodes are connected to the conductive member or the lead electrodes of the wiring substrate by a conductive adhesive. Alternatively, the light emitting element may have an opposite electrode structure, i.e. the pair of positive and negative electrodes may be provided respectively on the opposite sides. By providing a metal layer of silver, aluminum or the like or a dielectric reflecting film on the mounting surface of the light emitting element, the light extraction efficiency can be improved. The number of light emitting element mounted on each light emitting device may be one or plural. The size, shape and emission wavelength thereof are also optional. For example, red, green and blue light emitting elements may be mounted on a single light emitting device. A plurality of light emitting elements may be arranged irregularly, but regular or periodical arrangement such as columns-and-rows pattern and concentric pattern tends to result in preferred light distribution. Further, the plurality of light emitting elements may be connected in series or in parallel by the conductive member, the lead electrodes of the wiring substrate, the wires or the like.

(Base Body 30)

The base body is a mount base on which the light emitting element is mounted. In the first through fifth embodiments, the base body is mainly composed of the conductive member and the molding integrally molded with the conductive member. In the sixth through eighth embodiments, the base body is mainly composed of the wiring substrate and the protrusion provided on the wiring substrate. The base body may have a recess that includes a part of the conductive member on the bottom surface, or may be a plate without any recess (side wall).

(Conductive Member 20)

The conductive member may be made of a metal that can be connected to the light emitting element to conduct electricity. Specifically, it may be a lead frame or a lead electrode made of copper, aluminum, gold, silver, tungsten, iron, nickel, cobalt, molybdenum, an alloy thereof, phosphor bronze, iron-containing copper or the like. The surface thereof may be coated with a plating of silver, aluminum, rhodium, gold, copper or an alloy thereof or with a light reflecting film, of which silver is the most preferred since it exhibits the highest light reflection.

(Molding 25)

Examples of the base body material of the molding include thermoplastic resins such as aliphatic polyamide resins, semi-aromatic polyamide resins, polyethylene terephthalate, polycyclohexane terephthalate, liquid crystal polymers, polycarbonate resins, syndiotactic polystyrene, polyphenylene ether, polyphenylene sulfide, polyether sulfone resins, polyether ketone resins and polyallylate resins, and thermosetting resins such as polybismaleimide triazine resins, epoxy resins, silicone resins, silicone-modified resins, silicone-modified resins, polyimide resins and polyurethane resins. As a filler or a coloring pigment, the base body material may be mixed with particles or fibers of glass, silica, titanium oxide, magnesium oxide, magnesium carbonate, magnesium hydroxide, calcium carbonate, calcium hydroxide, calcium silicate, magnesium silicate, wollastonite, mica, zinc oxide, barium titanate, potassium titanate, aluminum borate, aluminum oxide, zinc oxide, silicon carbide, antimony oxide, zinc stannate, zinc borate, iron oxide, chromium oxide, manganese oxide, carbon black or the like. Besides, the molding may be made of glass, ceramics or the like.

(Wiring Substrate 22)

The wiring substrate may be made of a substrate of glass epoxy, glass, ceramics, various resins, aluminum or the like, and the lead electrodes and a wiring component are provided thereon which are connected to the light emitting element and terminals (pads) for external connection. In particular, preferred examples of ceramics include alumina, aluminum nitride, mullite, silicon carbide, silicon nitride and the like. Preferred examples of resins include epoxy resins, polyimide resins, phenol resins, BT resins, polyphthalamide resins (PPA), polyethylene terephthalate resins (PET), polybutylene terephthalate resins (PBT) and the like. The lead electrodes may be made of metal that can be connected to the light emitting element to conduct electricity. Specifically, the lead electrodes may be made of copper, aluminum, gold, silver, tungsten, iron, nickel, cobalt, molybdenum, an alloy thereof, phosphor bronze, iron-containing cooper or the like. The lead electrodes may be exposed on the upper, lower (back) or side surface of the base body, or may be formed inside the base body. In particular, the surface of the lead electrodes exposed on the upper surface of the base body may be coated with a plating of silver, aluminum, rhodium, gold, copper, an alloy thereof or the like or with a light reflecting film. Among them, silver may be preferably used since it exhibits high light reflection. The wiring substrate may have a recess or hole at a position for the protrusion. By engaging a part of the protrusion with the recess or hole, or by filling the recess or hole with a part of the protrusion, the adhesion between the wiring substrate and the protrusion can be enhanced. In this case, the recess or hole may be formed, for example, in a dot or linear shape in a top view.

It is preferred that the opening diameter of the recess or hole is smaller than the width of the protrusion.

(Protrusion 34)

The protrusion is provided on the upper surface of the wiring substrate mainly for providing the outward surface from which the surface of the sealing member rises. The protrusion is normally provided at the outer side of the light emitting element, but it may also be provided under the light emitting element (in other words, the light emitting element may be provided on the protrusion). The protrusion also serves as a light reflector that reflects the light laterally emitted from the light emitting element upward with its inner wall surface. For this reason, the protrusion is preferably made of a white material having high light reflectivity. Further, it is preferred that the protrusion is electrically insulated from the lead electrodes of the wiring substrate. Alternatively, if the protrusion is made of a translucent material such as approximately transparent material, the light emitting device can have wider light distribution. As for the resin, thermosetting resins, thermoplastic resins or the like may be used. Specifically, examples of resins include silicone resins, epoxy resins, phenol resins, BT resins, PPA, PET, PBT, fluororesins, polyolefin resins, polynorbornene resins and the like. Then, particles such as particles of titanium oxide, aluminum oxide, zirconium oxide, magnesium oxide or the like may be added to the base material of resins so that the light is effectively reflected. The protrusion is provided, for example, by ejecting it on the wiring substrate by a dispenser or the like and then solidifying it. Alternatively, the protrusion may be provided by fixedly placing a protrusion with a certain shape on the wiring substrate. In this case, the protrusion may be made of ceramics besides the above resins. Metal is also an option. To facilitate forming the high convex surface of the sealing member, it is preferred that at least the surface of the protrusion is made of a material having a critical surface tension of 50 mN/m or less. Particularly preferred examples of such materials include silicone resins, fluororesins, polyolefin resins polynorbornene resins are particularly preferred, of which silicone resins are preferred because of their high thermal resistance, high light resistance and comparatively satisfactory adhesiveness. The protrusion may be composed of a single layer or a plurality of layers.

(Sealing Member 40)

The sealing member seals the light emitting element, the wires and a part of the conductive member so as to protect them from dust, moisture external force and the like. The base material of the sealing member may be any material as long as it is electrically insulative, is translucent to the light emitted from the light emitting element (preferably a transmittance of 70% or more) and has fluidity before curing. Specifically, examples of such materials include silicone resins, silicone-modified resins, silicone-modified resins, epoxy resins, phenol resins, polycarbonate resins, acrylic resins, TPX resins, polynorbornene resins, and hybrid resins containing at least one of them. The base material may also be glass. Among them, silicone resins are preferred because of their high heat resistance, high light resistance and low volume shrinkage during solidification. Particularly preferred base material of the sealing member is a phenyl silicone resin-based material. If the sealing member has the convex surface as mentioned in the following examples, phenylsilicone resins are superior to dimethylsilicone resins in terms of the light extraction efficiency. Phenyl silicone resins also have satisfactory gas barrier properties, and make it easier to prevent the conductive member from being degraded by corrosive gas.

The base material of the sealing member may be mixed with various functional particles such as filler and phosphor. The filler may be a diffuser, a coloring agent or the like. Specifically, examples of fillers include silica, titanium oxide, magnesium oxide, magnesium carbonate, magnesium hydroxide, calcium carbonate, calcium hydroxide, calcium silicate, zinc oxide, barium titanate, aluminum oxide, iron oxide, chromium oxide, manganese oxide, glass, carbon black and the like. The filler particles may have a crushed shape or a globular shape. It may also have a hollow shape or a porous shape.

(Phosphor 50)

The phosphor absorbs at least a part of the primary light emitted from the light emitting element so as to emit a secondary light at a wavelength different from the primary light. Specifically, examples of such phosphors include cerium-activated yttrium-aluminum garnet (YAG), europium and/or chromium-activated nitrogen-containing calcium aluminosilicate ($CaO$—$Al_2O_3$—$SiO_2$), europium-activated silicate ($(Sr, Ba)_2SiO_4$) and the like. With such phosphors, the light emitting device can emit mixture of the visible primary light and the visible secondary light (e.g. white light), or can emit the visible secondary light by being excited by the ultraviolet primary light.

(Wavelength Converter 55)

The wavelength converter may be made of a translucent material containing the above-mentioned phosphor. Specifically, examples of such materials include a molding of the resin or glass as listed above for the sealing material blended with the phosphor, a sintered body of the phosphor and an inorganic binder, a crystal of the phosphor and the like. The wavelength converter may be provided such that a previously formed plate or film is pasted by a translucent adhesive or directly joining to the light emitting element, or a fluid material is applied on the light emitting element, or the phosphor is deposited on the light emitting element by electrophoretic deposition and then is impregnated with resin, or the like.

(Coating Members 70, 75)

The coating members cover the upper surface of the wiring substrate, the lower and side surfaces of the light emitting element and the like. It is particularly preferred that the coating members are made of a white material that can effectively reflect the light emitted from the light emitting element and is electrically insulative. Specifically, such materials include the resins listed above for the protrusion and the resins with particles listed above for the protrusions.

(Wires)

The wires electrically connect the electrodes of the light emitting element to the conductive member or the lead electrodes of the wiring substrate. The wires may be made of metal wires of gold, copper, silver, platinum, aluminum or an alloy thereof. Gold wires are particularly preferred since they are less breakable by the stress from the sealing member and have high heat resistance.

(Adhesive)

The adhesive fixes the light emitting element on the base body or the wiring substrate. As for insulative adhesives, examples of such adhesives include epoxy resins, silicone resins, polyimide resins, modified resins thereof, hybrid resins thereof, and the like. As for conductive adhesives, examples of such adhesives include conductive pastes of silver, gold palladium or the like, solders such as gold-tin solder, brazing filler metals of a low-melting metal, and the like.

EXAMPLES

Examples of the present invention will be described in detail below. It is understood that the present invention is not limited to the following examples.

Example 1

A light emitting device of Example 1 has an appearance similar to the light emitting device 100 of FIG. 1, and is a surface-mount top-view LED that includes a base body of 5.0 mm height, 6.5 mm in width and 1.35 mm in thick. The base body is composed of a conductive member that is a pair of positive and negative lead frames of a copper alloy with silver-plating finish and an epoxy resin molding that is integrally molded with the conductive member and contains a titanium oxide white pigment and a silica filler. The base body is prepared by placing the conductive member in a metal mold, injecting thereto the material of the molding and solidifying it. The conductive member defines a part of the bottom surface of a recess with a part of its surface, and extends out of the molding.

At approximately the center of the base body, the molding defines the recess that has an exactly round shape of 4.3 mm in diameter and 0.85 mm in depth in a top view. The recess has two steps, of which the upper step has an exactly round shape of 0.3 mm in depth and 0.33 mm in width in a top view. Further, the upper step is provided with a protrusion that has an exactly round shape of 0.16 mm in width and 0.1 mm in height in a top view. (In other words, the upper step is formed at a position in 0.2 mm depth, and is surrounded by a groove having an exactly round shape of 0.17 mm in width and 0.1 mm in depth in a top view.) The outer-side surface of the protrusion is inclined at an angle of 78 to 82 degrees relative to the upper surface. Further, the protrusion has convex rounded edges between the outer-side or inner-side surface and the upper surface. The inward surface of the groove, i.e. the inner wall surface of the upper step of the recess, is also inclined similarly relative to the upper surface of the base body.

On the bottom surface of the recess of the base body, six pieces of light emitting elements are pasted on the negative electrode of the conductive member by a translucent epoxy resin adhesive, and the electrodes of each light emitting element are connected to the positive and negative electrodes of the conductive member by gold wires. The light emitting elements are LED chips, each of which has a size of 500 µm in height, 290 µm in width and 120 µm in thickness, is composed of a nitride semiconductor n-type layer, an active layer and a p-type layer laminated on a sapphire substrate in this order, and is capable of emitting blue light (a center wavelength of approximately 460 nm).

The sealing member is placed inside the recess of the base body covering the light emitting elements. The sealing member contains a phenylsilicone resin having a refractive index of 1.53 as its base material and a YAG phosphor dispersed in the base material. The surface of the sealing member mostly rises from the outer side surface, i.e. the outward surface of the protrusion of the base body, or the convex rounded edge, and has an approximately convex curved shape. The height of the surface of the sealing member (around the top) is 1.3 mm from the upper surface of the protrusion. The sealing member is formed by dropping the fluid material using a dispenser such that its surface mostly rises from the outward surface of the protrusion of the base body, and then directly curing it by heat.

Comparative Example 1

A light emitting device of Comparative Example 1 has the same structure with the light emitting device of Example 1 except that the surface of the sealing member is connected to the inward surface of the protrusion and is formed in a flat surface that is approximately flush with the upper surface of the protrusion.

(Evaluation 1)

The light extraction efficiency of Example 1 and Comparative Example 1 is evaluated by measuring the luminous flux. Specifically, each light emitting device is powered (in parallel) by a forward current of 350 mA to emit light, and the luminous flux of the light is measured. The light emitting device of Comparative Example 1 exhibits a luminous flux of 119.8 (lm), while the light emitting device of Example 1 exhibits a luminous flux of 129.4 (lm). These values of luminous flux are equivalent values in chromaticity (x, y)=(0.345, 0.357) for comparison. As mentioned above, the light emitting device of Example 1 has a luminous flux 8.1% higher than that of the light emitting device of Comparative Example 1, which shows that the high convex surface of the sealing member allows for high light extraction efficiency.

Example 2

A light emitting device of Example 2 has an appearance similar to the light emitting device 400 of FIG. 6, and is a surface-mount side-view LED that includes a base body of 2.0 mm in height, 3.0 mm in width and 1.2 mm in thickness. The base body is composed of a conductive member that is a pair of positive and negative lead frames of a copper alloy with silver-plating finish and a polyphthalamide resin molding that is integrally molded with the conductive member and contains a titanium oxide white pigment and a silica filler. The base body is prepared by placing the conductive member in a metal mold, injecting thereto the material of the molding and solidifying it. The conductive member defines a part of the bottom surface of a recess with a part of its surface, and extends out of the molding.

At approximately the center of the base body, the molding defines the recess that has a rectangular shape of 1.6 mm in height, 2.2 mm in width and 0.45 mm in depth in a top view. On the upper surface of the base body, protrusions are formed at both sides of the recess in the longitudinal direction. The protrusions extend in the transverse direction of the recess, and have a linear shape of 1.6 mm in length, 0.26 mm in width and 0.21 mm in height in a top view. The protrusions have an approximately convex curved cross-sectional shape.

On the bottom surface of the recess of the base body, one light emitting element is pasted on the negative electrode of the conductive member by a translucent epoxy resin adhesive, and the electrodes of the light emitting element are connected to the positive and negative electrodes of the conductive member by gold wires. The light emitting element is an LED chip that has a size of 200 µm in height, 400 µm in width and 85 µm in thickness, is composed of a nitride semiconductor n-type layer, an active layer and a p-type layer laminated on a sapphire substrate in this order, and is capable of emitting blue light (a center wavelength of approximately 460 nm).

The sealing member is placed inside the recess of the base body covering the light emitting element. The sealing member contains a phenylsilicone resin having a refractive index of 1.53 as its base material and a YAG phosphor dispersed in the base material. The surface of the sealing member has an approximately convex curved shape, and rises from the outward surface of the protrusions in the longitudinal direction of the base body. The height of the surface of sealing member (around the top) is 0.13 mm from the upper surface of the protrusion. The sealing member is formed by dropping the fluid material using a dispenser such that its surface rises from the outward surface of the protrusions in the longitudinal direction of the base body, and then directly curing it by heat.

Example 3

A light emitting device of Example 3 has the same structure with the light emitting device of Example 2 except that the base material of the sealing member is a dimethylsilicone resin having a refractive index of 1.41.

Comparative Example 2

A light emitting device of Comparative Example 2 has the same structure with the light emitting device of Example 2 except that the base body does not have a protrusion, and the surface of the sealing member is a flat surface that is connected to the inward surface of the recess and is approximately flush with the upper surface of the recess.

Comparative Example 3

A light emitting device of Comparative Example 3 has the same structure with the light emitting device of Comparative Example 2 except that the base material of the sealing member is a dimethylsilicone resin having a refractive index of 1.41.

(Evaluation 2)

The light extraction efficiency of Examples 2 and 3 and Comparative Examples 2 and 3 is evaluated by measuring the luminous flux. Specifically, each light emitting device is powered by a forward current of 20 (mA) to emit light, and the luminous flux of the light is measured. The following values of luminous flux are equivalent values in chromaticity (x, y)=(0.300, 0.286) for comparison.

(Evaluation 3)

Furthermore, the reliability of Examples 2 and 3 and Comparative Examples 2 and 3 are evaluated by a sulfuration test. Specifically, a light emitting device and 1 g of sodium sulfide are placed in a sealed container and left at 80° C. for 24 hours. The maintenance factor of the luminous flux before and after the test is thus measured.

The results of the above two evaluations are shown in Table 1.

TABLE 1

|  | Base material of sealing member | Surface shape of sealing member | Initial luminous flux (lm) | Relative initial luminous flux (%) | Maintenance factor of luminous flux (%) |
| --- | --- | --- | --- | --- | --- |
| Comparative Example 2 | Phenyl silicone resin | Flat | 6.77 | 98.9 | 91.9 |
| Comparative Example 3 | Dimethylsilicone resin | Flat | 6.84 | 100.0 | 74.3 |
| Example 2 | Phenyl silicone resin | Convex | 7.51 | 109.7 | 98.8 |
| Example 3 | Dimethylsilicone resin | Convex | 7.24 | 105.7 | 85.9 |

As seen in Table 1, the initial luminous fluxes of the light emitting devices of Examples 2 and 3 are respectively 9.7% and 5.7% higher than that of Comparative Example 3, which shows the superiority in light extraction efficiency. On the other hand, the initial luminous flux of the light emitting device of Comparative Example 2 is 1.1% lower than that of the light emitting device of Comparative Example 3. These results show that a combination of the convex surface of the sealing member and the phenyl silicone resin base material of the sealing member allows for particularly high light extraction efficiency of the light emitting device. Further, the convex surface of the sealing member enhances its gas barrier properties and prevents the conductive member from being discolored by a sulfur-containing gas, which offers high reliability of the light emitting device.

Example 4

A light emitting device of Example 4 is an example of the light emitting device 600 of FIG. 8, and is a COB (chip-on-board) LED module that emits white light. The wiring substrate 22 is made of an aluminum board of 16 mm in height, 19 mm in width and 1.0 mm in thickness on the upper surface of which lead electrodes with gold-plating finish are provided. The protrusion 34 is made of a dimethylsilicone resin containing 30% by weight of titanium oxide with respect to the resin, and has a ring shape of 10 mm in outer diameter, 1.0 mm in width and 0.5 mm in height, which is formed by drawing the shape using a dispenser and then solidifying it. The protrusion 34 has a semi-circular cross-sectional shape.

At the inner side of the protrusion 34 on the upper surface of the wiring substrate 22, 110 pieces of light emitting elements 10 are pasted by a translucent epoxy resin adhesive, and are connected to each other between adjacent light emitting elements 10 or to lead electrodes of the wiring substrate 22 by gold wires (10 sets of 11 pieces of the light emitting elements 10 in series are connected in parallel). The light emitting elements 10 are LED chips each of which has a size of 290 μm in height, 500 μm in width and 80 μm in thickness, is composed of a nitride semiconductor n-type layer, an active layer and a p-type layer laminated on a sapphire substrate in this order, and is capable of emitting blue light (a center wavelength of approximately 460 nm).

The sealing member 40 includes two components, i.e. a first sealing portion 401 of the lower layer and a second sealing portion 402 of the upper layer. The first sealing portion 401 contains a dimethylsilicone resin having a refractive index of 1.41 as its base material and a YAG phosphor dispersed in the base material. The first sealing portion 401 covers all of the light emitting elements 10, and fills up to near the top of the protrusion 34. The first sealing portion 401 is raised along the protrusion 34 at the peripheral part, and is recessed at the center part. The second sealing portion 402 contains the same dimethylsilicone resin with the first sealing portion 401 as its base material and 3% by weight of colloidal silica with respect to the base material as an additive. The surface of the sealing member 40 (the surface of the second sealing portion 401) mostly rises from the outward surface 27 of the protrusion 34, and has an approximately convex curved shape. The height of the surface of the sealing member 40 (around the top) is 3.0 mm from the upper surface of the wiring substrate. The second sealing portion 402 is formed by placing its fluid material using a dispenser such that the surface mostly rises from the outward surface 27 of the protrusion 34, and then directly curing it by heat.

Comparative Example 4

A light emitting device of Comparative Example 4 has the same structure with the light emitting device of Example 4 except that the sealing member consists of only the first sealing portion, and the surface thereof is a nearly flat surface that has approximately the same height with the protrusion.
(Evaluation 4)

The light extraction efficiency of Example 4 and Comparative Example 4 is evaluated by measuring the luminous flux. Specifically, each light emitting device is powered by a forward current of 320 (mA) to emit light, and the luminous flux of the light is measured. The light emitting device of Comparative Example 4 exhibits a luminous flux of 1,113 (lm), while the light emitting device of Example 4 exhibits a luminous flux of 1,152 (lm). These values of luminous flux are equivalent values in chromaticity x=0.32 for comparison. As mentioned above, the light emitting device of Example 4 has an initial luminous flux that is 3.5% higher than that of the light emitting device of Comparative Example 4, which shows that the high convex surface of the sealing member allows for high light extraction efficiency.

Example 5

Figure 13A:
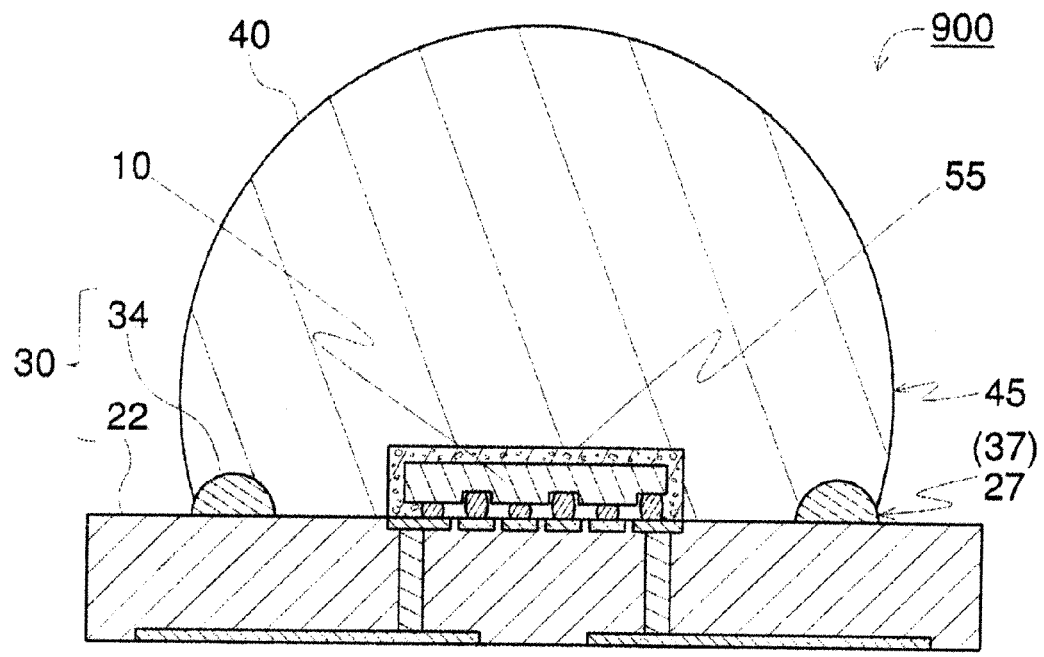
FIG. 13A is a schematic cross sectional view of a light emitting device according to an example of the present invention.

FIG. 13A is a schematic cross sectional view of a light emitting device of Example 5. The light emitting device 900 of FIG. 13A is an LED that emits white light. A wiring substrate 22 is an alumina board of 3.5 mm in height, 3.5 mm in height and 0.45 mm in thickness equipped with a copper-tungsten as a heat sink, on the upper surface of which lead electrodes with gold-plating finish are provided. The protrusion 34 is made of a dimethylsilicone resin containing 30 wt % of titanium oxide with respect to the resin and has a ring shape of 2.6 mm in outer diameter, 0.4 mm in width and 0.15 mm in height, which is formed by drawing the shape using a dispenser and then solidifying it. The protrusion 34 has a semicircular cross sectional shape.

At the inner side of the protrusion 34 on the upper surface of the wiring substrate 22, one light emitting element 10 is mounted by flip-chip mounting using gold-tin eutectic solder, so as to be connected to the lead electrodes of the wiring substrate 22. The light emitting element 10 is an LED chip of 1.0 mm in height, 1.0 mm in width and 110 μm in thickness that is composed of a nitride semiconductor n-type layer, an active layer and a p-type layer laminated on a sapphire substrate in this order, and is capable of emitting blue light (a center wavelength of approximately 460 nm). Further, the light emitting element 10 is covered with a wavelength converter 55. The wavelength converter 55 is formed by depositing a YAG phosphor on the light emitting element 10 by electrophoretic deposition and then impregnating it with a phenyl silicone resin having a refractive index of 1.51.

The sealing member 40 contains a dimethylsilicone resin having a refractive index of 1.41 as its base material and 2.5 wt % of colloidal silica with respect to the base material. The surface of the sealing member 40 mostly rises from the outward surface 27 of the protrusion 34, and has an approximately convex curved shape. The height of the surface of the sealing member 40 (around the top) is 3.0 mm from the upper surface of the wiring substrate. The sealing member 40 is formed by dropping the fluid material using a dispenser such that its surface mostly rises from the outward surface 27 of the protrusion 34, and then directly curing it by heat.

Example 6

A light emitting device of Example 6 has the same structure with the light emitting device of Example 5 except that the protrusion 34 does not contain titanium oxide and is nearly transparent.

Comparative Example 5

Figure 13B:
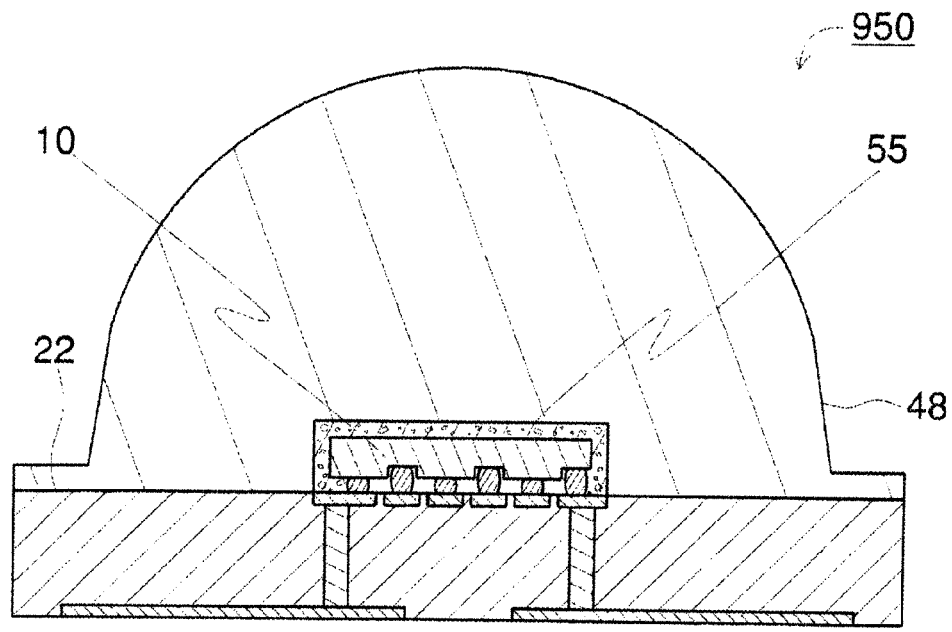
FIG. 13B is a schematic cross sectional view of a light emitting device according to a Comparative Example.

FIG. 13B is a schematic cross sectional view of a light emitting device of Comparative Example 5. The light emitting device 950 of FIG. 13B is different from the light emitting device 900 of Example 5 in the method of forming a sealing member 48. The light emitting device 950 includes the same light emitting element 10, wiring substrate 22 and wavelength converter 55 with those of the light emitting device 900 of Example 5, and the material of the sealing member 48 is also the same with the light emitting device of Example 5. The sealing member 48 is directly formed on the wiring substrate 22 by compression molding. No protrusion is provided. The sealing member 48 has a convex surface, and is φ2.6 mm in outer diameter and 1.55 mm in height (around the top) from the upper surface of the wiring substrate.
(Evaluation 5)

The light extraction efficiency of Examples 5 and 6 and Comparative Example 5 is evaluated by measuring the initial luminous flux. Specifically, each light emitting device is powered by a forward current of 350 (mA) to emit light, and the luminous flux of the light is measured. The light emitting device of Comparative Example 5 exhibits a luminous flux of 121.6 (lm), while the light emitting device of Example 4 exhibits a luminous flux of 127.1 (lm) and the light emitting device of Example 5 exhibits a luminous flux of 124.4 (lm). These values of luminous flux are equivalent values in chromaticity x=0.355 for comparison. As mentioned above, the light emitting devices of Examples 5 and 6 have initial luminous fluxes that are respectively 4.5% and 2.3% higher than that of the light emitting device of Comparative Example 5, which shows the superiority in light extraction efficiency.

As illustrated in FIG. 13B, since the sealing member 48 is molded on the wiring substrate using a metal mold, for example by compression molding, it includes a center part with a convex surface as well as a flange that serves as a runner of the sealing member 48 and continuously extends from the periphery of the center part on the wiring substrate 22. Since the light emitted from the light emitting element 10 is partially introduced to the flange, the flange increases the light loss caused by absorption to the wiring substrate 22, which results in low light extraction efficiency. In contrast, as illustrated in FIG. 13A, since the sealing member 40 is formed by dropping, it does not have such flange and can effectively extract the light emitted from the light emitting element 10.

The light emitting devices of the present invention are applicable to backlight light sources of liquid crystal displays, various lighting equipment, large displays, various display apparatuses such as advertisements and guideboards, as well as image readers of digital camcorders, fax machines, copiers and scanners, projectors and the like.

The invention claimed is:

1. A method for manufacturing a light emitting device, comprising:
   providing an assembly comprising:
      a base body comprising:
         a conductive member, and
         a molding that is molded with the conductive member, and
      a light emitting element electrically connected to the conductive member; and
   forming a sealing member that seals the light emitting element,
   wherein said forming of the sealing member comprises dispensing a sealing member material on the base body,
   wherein the sealing member is formed such that at least a part of a peripheral edge of the sealing member is located on an outward-facing surface of the conductive member or the molding, and
   wherein the outward-facing surface is a convex curved surface, or a lower-side surface continuing from the convex curved surface.

2. The method according to claim 1, wherein at least a part of an inward-facing surface of the base body comprises a convex curved surface at a top part thereof, said at least a part of the inward surface being located at an inner side of the peripheral edge of the sealing member.

3. The method according to claim 1, wherein the base body has a protrusion or a groove, said at least a part of the peripheral edge of the sealing member being located on an outward-facing surface of the protrusion or the groove.

4. The method according to claim 3, wherein the base body has a first protrusion or a first groove, and a second protrusion or a second groove located at an outer side of the first protrusion or the first groove, said at least a part of the peripheral edge of the sealing member being located on an outward-facing surface of any of the first and second protrusions and the first and second grooves.

5. The method according to claim 4,
   wherein the sealing member comprises:
      a first sealing portion for sealing the light emitting element; and
      a second sealing portion for sealing the first sealing portion,
   wherein the first sealing portion is formed such that at least a part of a peripheral edge of the first sealing portion is located on an outward-facing surface of the first protrusion or the first groove, and the second sealing portion is formed such that at least a part of a peripheral edge of the second sealing portion is located on an outward-facing surface of the second protrusion or the second groove.

6. The method according to claim 5, wherein the sealing member contains a phosphor only in the first sealing portion, the phosphor being excitable by light emitted from the light emitting element.

7. The method according to claim 3, wherein the protrusion or the groove is rounded at corners or at an entire part in a top view of the base body.

8. The method according to claim 3, wherein the protrusion or the groove is formed in a frame shape surrounding the light emitting element.

9. The method according to claim 1, wherein the base body has a recess inside which the light emitting element is mounted, the peripheral edge of the sealing member being located inside the recess.

10. The method according to claim 1, further comprising, before dispensing the sealing member material on the base body, forming a coating having a critical surface tension of 50 mN/m or less, only on the outward-facing surface of the base body on which the peripheral edge of the sealing member is located, or on the outward-facing surface as well as a structural surface outside the outward-facing surface.

11. The method according to claim 1, wherein a base material of the sealing member contains a phenyl silicone resin as a major component.

12. A light emitting device, comprising:
   a base body comprising:
      a conductive member, and
      a molding that is molded with the conductive member;
   a light emitting element electrically connected to the conductive member; and
   a sealing member that seals the light emitting element,
   wherein at least a part of a peripheral edge of the sealing member is located on an outward-facing surface of the conductive member or the molding,
   wherein, at a contact point between the outward-facing surface and the peripheral edge of the sealing member, the sealing member makes an angle of approximately a contact angle or less to the outward-facing surface or to a tangent plane of the outward-facing surface, and
   wherein the outward-facing surface is a convex curved surface, or a lower-side surface continuing from the convex curved surface.

13. The light emitting device according to claim 12, wherein at least a part of the peripheral edge of the sealing member makes an angle of more than the contact angle to a horizontal plane.

14. The light emitting device according to claim 12, wherein the base body has a protrusion or a groove, said at least a part of the peripheral edge of the sealing member being located on the outward-facing surface of the protrusion or the groove.

15. The light emitting device according to claim 14,
   wherein the sealing member comprises:
      a first sealing portion for sealing the light emitting element; and
      a second sealing portion for sealing the first sealing portion,
   wherein only the first sealing portion contains a phosphor that is excitable by light emitted from the light emitting element, and
   wherein at least a part of a peripheral edge of the second sealing portion is located on the outward-facing surface of the protrusion or the groove.

16. The light emitting device according to claim 14, wherein the base body has a recess inside which the light emitting element is mounted, the protrusion or the groove being located inside the recess.

17. The light emitting device according to claim 14, wherein the base body has a recess inside which the light emitting element is mounted, and
   the protrusion or the groove being located at an outer side of the recess.

18. The light emitting device according to claim 14, wherein the protrusion or the groove is formed in a frame shape surrounding the light emitting element.

19. The light emitting device according to claim 17, wherein the protrusion or the groove are formed in a strip shape on both sides of the recess.

20. The light emitting device according to claim 14, wherein the protrusion or the groove is rounded at corners or at an entire part in a top view of the base body.

21. The light emitting device according to claim 12, wherein the base body has a first protrusion or a first groove, and a second protrusion or a second groove at an outer side of the first protrusion or the first groove,
the sealing member comprises:
a first sealing portion for sealing the light emitting element; and
a second sealing portion for sealing the first sealing portion,
wherein only the first sealing portion contains a phosphor that is excitable by light emitted from the light emitting element,
wherein at least a part of a peripheral edge of the first sealing portion is located on an outward-facing surface of the first protrusion or the first groove, and
wherein at least a part of a peripheral edge of the second sealing portion is located on an outward-facing surface of the second protrusion or the second groove.

22. The light emitting device according to claim 12, wherein the base body has an inward-facing surface at an outer side of the outward-facing surface on which the peripheral edge of the sealing member is located.

23. The light emitting device according to claim 12, wherein a base material of the sealing member contains a phenyl silicone resin as a major component.

24. A method for manufacturing a light emitting device, comprising:
providing a wiring substrate on which a light emitting element is mounted;
forming a protrusion at an outer side of the light emitting element on an upper surface of the wiring substrate; and
dispensing a sealing member that seals the light emitting element, the sealing member being formed such that at least a part of a peripheral edge of the sealing member is located on an outward-facing surface of the protrusion,
wherein the outward-facing surface is a convex curved surface, or a lower-side surface continuing from the convex curved surface.

25. The method according to claim 24, wherein the outward-facing surface is inclined so as to face the upper surface of the wiring substrate.

26. The method according to claim 24, wherein at least a part of an inward-facing surface of the protrusion comprises a convex curved surface at a top part thereof, said part of the inward-facing surface being located at an inner side of the peripheral edge of the sealing member.

27. The method according to claim 24, wherein in the step of forming the protrusion, a first protrusion and a second protrusion located at an outer side of the first protrusion are formed on the upper surface of the wiring substrate, and
in the step of dispensing the sealing member, the sealing member is formed such that at least a part of the peripheral edge of the sealing member is located on an outward-facing surface either one of the first protrusion or the second protrusion.

28. The method according to claim 27,
wherein the sealing member comprises:
a first sealing portion that seals the light emitting element, and
a second sealing portion that seals the first sealing portion,
wherein the first sealing portion is formed such that at least a part of a peripheral edge of the first sealing portion is located on an outward-facing surface of the first protrusion, and
wherein the second sealing portion is formed such that at least a part of a peripheral edge of the second sealing portion is located on an outward-facing surface of the second protrusion.

29. The method according to claim 28, wherein the sealing member contains a phosphor only in the first sealing portion, the phosphor being excitable by light emitted from the light emitting element.

30. The method according to claim 24, wherein the protrusion is rounded at corners or at an entire part in a top view.

31. The method according to claim 24, wherein the protrusion is formed in a frame shape surrounding the light emitting element.

32. The method according to claim 24,
wherein a plurality of the light emitting elements are arranged on the wiring substrate,
wherein protrusions are formed on both sides of the light emitting elements in a strip shape extending approximately parallel to an alignment direction of the plurality of light emitting element,
wherein in the step of dispensing the sealing member, the sealing member is formed so as to bridge between the protrusions on the both sides of the light emitting elements, and
wherein the method further comprises, after dispensing the sealing member, cutting the sealing member and the wiring substrate at one or more positions between the plurality of light emitting elements.

33. The method according to claim 24, wherein at least the surface of the protrusion is formed from a material having a critical surface tension of 50 mN/m or less.

34. The method according to claim 24, further comprising, before the step of dispensing the sealing member, forming a coating having a critical surface tension of 50 mN/m or less, only on the outward-facing surface of a base body on which the peripheral edge of the sealing member is located, or on the outward-facing surface as well as a structural surface outside the outward-facing surface, the base body comprising the wiring substrate and the protrusion.

35. The method according to claim 24, wherein a base material of the sealing member contains a phenyl silicone resin as a major component.

36. A light emitting device, comprising:
a light emitting element;
a wiring substrate having an upper surface on which the light emitting element is mounted, the wiring substrate comprising a protrusion located at an outer side of the light emitting element on the upper surface of the wiring substrate; and
a sealing member that seals the light emitting element,
wherein at least a part of a peripheral edge of the sealing member is located on an outward-facing surface of the protrusion, wherein the sealing member makes an angle of approximately a contact angle or less to the outward-facing surface or to a tangent plane of the outward-facing surface, and wherein the outward-facing surface is a convex curved surface or a lower-side surface continuing from the convex curved surface.

37. The light emitting device according to claim 36, wherein at least a part of the peripheral edge of the sealing member makes an angle of more than the contact angle to a horizontal plane.

38. The light emitting device according to claim 36, wherein the outward-facing surface is inclined so as to face the upper surface of the wiring substrate.

39. The light emitting device according to claim 36, wherein the sealing member comprises:
- a first sealing portion that seals the light emitting element, and
- a second sealing portion that seals the first sealing portion, wherein only the first sealing portion contains a phosphor that is excitable by light emitted from the light emitting element, and wherein at least a part of a peripheral edge of the second sealing portion is located on the outward-facing surface of the protrusion.

40. The light emitting device according to claim 36, wherein the protrusion is formed in a frame shape surrounding the light emitting element.

41. The light emitting device according to claim 36, wherein the protrusion is rounded at corners or at an entire part in a top view of the base body.

42. The light emitting device according to claim 36, wherein at least a surface of the protrusion is made of a material having a critical surface tension of 50 mN/m or less.

43. The light emitting device according to claim 36, wherein a base material of the sealing member contains a phenyl silicone resin as a major component.

* * * * *

UNITED STATES PATENT AND TRADEMARK OFFICE
CERTIFICATE OF CORRECTION

PATENT NO. : 10,090,446 B2  
APPLICATION NO. : 14/118176  
DATED : October 2, 2018  
INVENTOR(S) : Masafumi Kuramoto et al.

Page 1 of 1

It is certified that error appears in the above-identified patent and that said Letters Patent is hereby corrected as shown below:

In the Claims

Column 37, Line 27 Claim 1:
Replace "member or the molding, and" with --member or the molding, the outward-facing surface being a surface that faces away from the light emitting element in a top view of the light emitting device, and--

Column 38, Line 28 Claim 12:
Replace "conductive member or the molding," with --conductive member or the molding, the outward-facing surface being a surface that faces away from the light emitting element in a top view of the light emitting device,--

Column 39, Lines 46-47 Claim 24:
Replace "is located on an outward-facing surface of the protrusion," with --is located on an outward-facing surface of the protrusion, the outward-facing surface being a surface that faces away from the light emitting element in a top view of the light emitting device,--

Column 40, Line 67 Claim 36:
Replace "protrusion," with --protrusion, the outward-facing surface being a surface that faces away from the light emitting element in a top view of the light emitting device,--

Signed and Sealed this  
Twenty-second Day of January, 2019

Andrei Iancu  
*Director of the United States Patent and Trademark Office*